United States Patent
Kao et al.

(10) Patent No.: US 11,990,537 B2
(45) Date of Patent: May 21, 2024

(54) HETEROJUNCTION BIPOLAR TRANSISTOR AND POWER AMPLIFIER

(71) Applicant: WIN SEMICONDUCTORS CORP., Taoyuan (TW)

(72) Inventors: Chih-Yang Kao, Taoyuan (TW); Chien-Rong Yu, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 169 days.

(21) Appl. No.: 17/847,778

(22) Filed: Jun. 23, 2022

(65) Prior Publication Data
US 2022/0416062 A1    Dec. 29, 2022

Related U.S. Application Data

(60) Provisional application No. 63/216,063, filed on Jun. 29, 2021.

(51) Int. Cl.
| | | |
|---|---|---|
| *H01L 29/737* | (2006.01) | |
| *H01L 29/08* | (2006.01) | |
| *H01L 29/10* | (2006.01) | |
| *H01L 29/66* | (2006.01) | |

(52) U.S. Cl.
CPC ...... *H01L 29/7371* (2013.01); *H01L 29/0817* (2013.01); *H01L 29/0821* (2013.01); *H01L 29/1004* (2013.01); *H01L 29/66242* (2013.01)

(58) Field of Classification Search
CPC ............. H01L 29/7371; H01L 29/1004; H01L 29/66242; H01L 29/42304; H01L 29/737
See application file for complete search history.

(56) References Cited

U.S. PATENT DOCUMENTS

| | | | |
|---|---|---|---|
| 11,139,390 B2 | 10/2021 | Takahashi | |
| 2001/0023947 A1* | 9/2001 | Gutierrez-Aitken | ........................ H01L 29/1004 257/E29.189 |
| 2003/0218184 A1 | 11/2003 | Yanagisawa | |
| 2005/0133820 A1* | 6/2005 | Min | .................. H01L 29/66318 257/E29.189 |

OTHER PUBLICATIONS

Chinese language office action dated Feb. 9, 2023, issued in application No. TW 111123989.

\* cited by examiner

*Primary Examiner* — Syed I Gheyas
(74) *Attorney, Agent, or Firm* — McClure, Qualey & Rodack, LLP

(57) ABSTRACT

A heterojunction bipolar transistor includes: a substrate; a base mesa disposed on the substrate, wherein the base mesa includes a collector layer and a base layer disposed on the collector layer, and wherein in a top view, the base layer includes a first edge and a second edge opposite to the first edge; an emitter layer disposed on the base layer; a base electrode disposed on the substrate and connected to the base layer; a dielectric layer disposed on the base electrode, wherein a first via hole is formed in the dielectric layer at the first edge of the base layer, and a second via hole is formed in the dielectric layer at the second edge of the base layer; and a conductive feature disposed on the dielectric layer, wherein the conductive feature is connected to the base electrode through the first via hole and the second via hole.

20 Claims, 18 Drawing Sheets

HETEROJUNCTION BIPOLAR TRANSISTOR AND POWER AMPLIFIER

CROSS REFERENCE TO RELATED APPLICATIONS

This application claims priority of provisional application of U.S. Patent Application No. 63/216,063 filed on Jun. 29, 2021, the entirety of which is incorporated by reference herein.

BACKGROUND

Technical Field

The present disclosure relates to a heterojunction bipolar transistor (HBT) and a power amplifier (PA), and in particular it relates to a feature of double signal input.

Description of the Related Art

A heterojunction bipolar transistor (HBT) is a bipolar junction transistor with two different materials with different energy band-gaps. The base resistance of the heterojunction bipolar transistor may impact the maximum operating frequency and the device performance (such as the maximum stable gain (MSG) or the maximum available gain (MAG) of the heterojunction bipolar transistor). In order to achieve higher efficiency, higher output power, and higher linearity, the overall base resistance of the heterojunction bipolar transistor needs to be reduced further. Therefore, these and related issues need to be addressed through the design and optimization of the heterojunction bipolar transistor.

SUMMARY

In an embodiment, a heterojunction bipolar transistor includes: a substrate; a bottom sub-collector layer disposed on the substrate; an upper sub-collector layer disposed on the bottom sub-collector layer; a collector layer disposed on the upper sub-collector layer; and a base layer disposed on the collector layer. The base layer, the collector layer, and the upper sub-collector layer form a base mesa. In a top view, the base layer includes a first side and a second side opposite to the first side. The heterojunction bipolar transistor further includes: an emitter layer disposed on the base layer; a first dielectric film disposed on the bottom sub-collector layer and the base mesa; a base electrode disposed on the first dielectric film and connected to the base layer through a first via hole disposed in the first dielectric film; a second dielectric film disposed on the base electrode; and a first conductive layer disposed on the second dielectric film. The first conductive layer is connected to the base electrode through a second via hole disposed in the second dielectric film at the first side of the base layer, and the first conductive layer is connected to the base electrode through a third via hole disposed in the second dielectric film at the second side of the base layer. The second via hole and the third via hole are laterally spaced away from the base layer.

In another embodiment, a heterojunction bipolar transistor includes a substrate and a base mesa disposed on the substrate. The base mesa includes a collector layer and a base layer disposed on the collector layer. In a top view, the base layer includes a first edge and a second edge opposite to the first edge. The heterojunction bipolar transistor further includes: an emitter layer disposed on the base layer; a base electrode disposed on the substrate and connected to the base layer; and a dielectric layer disposed on the base electrode. A first via hole is formed in the dielectric layer at the first edge of the base layer, and a second via hole is formed in the dielectric layer at the second edge of the base layer. A conductive feature is disposed on the dielectric layer, wherein the conductive feature is connected to the base electrode through the first via hole and the second via hole.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1A:
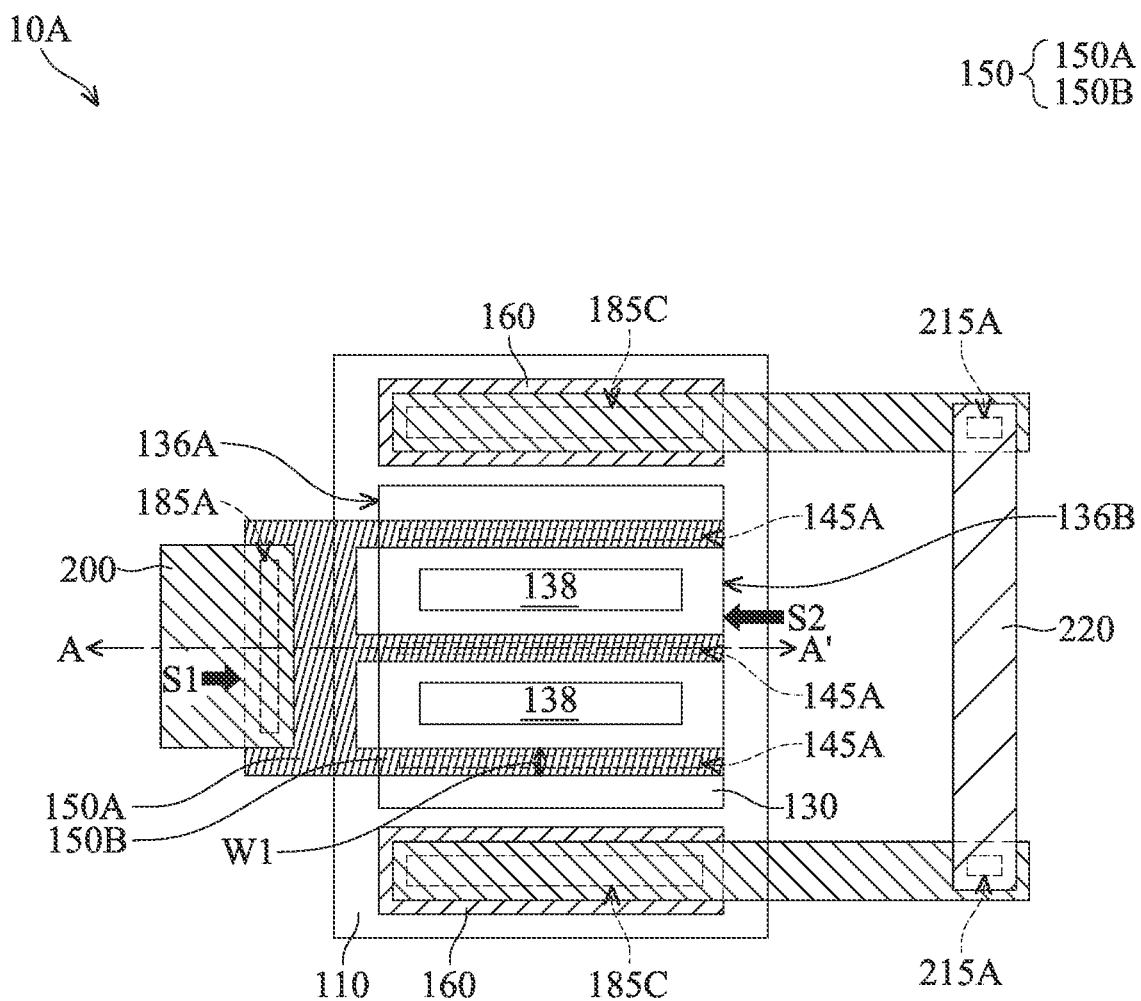
FIGS. 1A and 1C are respectively a top view and a cross-sectional view of a heterojunction bipolar transistor, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically +5% of the stated value, more typically +3% of the stated value, more typically +2% of the stated value, more typically ±1% of the stated value, and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity, and does not in itself dictate a relationship between the various embodiments and/or configurations discussed.

In a high-frequency heterojunction bipolar transistor or a power amplifier having the heterojunction bipolar transistor, a smaller signal (such as a lower voltage or a smaller current) may be input into the base terminal, and may be transformed into a larger signal (such as a higher voltage or a larger current) to be output from the collector terminal. If the base resistance is excessive, the signal input may be affected, which in turn may impact the device performance during operation. The inventor has discovered that the base resistance can be significantly reduced by adding a new signal input to the existing signal input at the base terminal. With the configuration of double signal input, the stability factor (when k=1) for the maximum stable gain (MSG) and/or the maximum available gain (MAG) may be prolonged toward a higher frequency. As a result, the heterojunction bipolar transistor and the power amplifier may exhibit a more superior gain performance under a higher operating frequency.

Figure 1B:
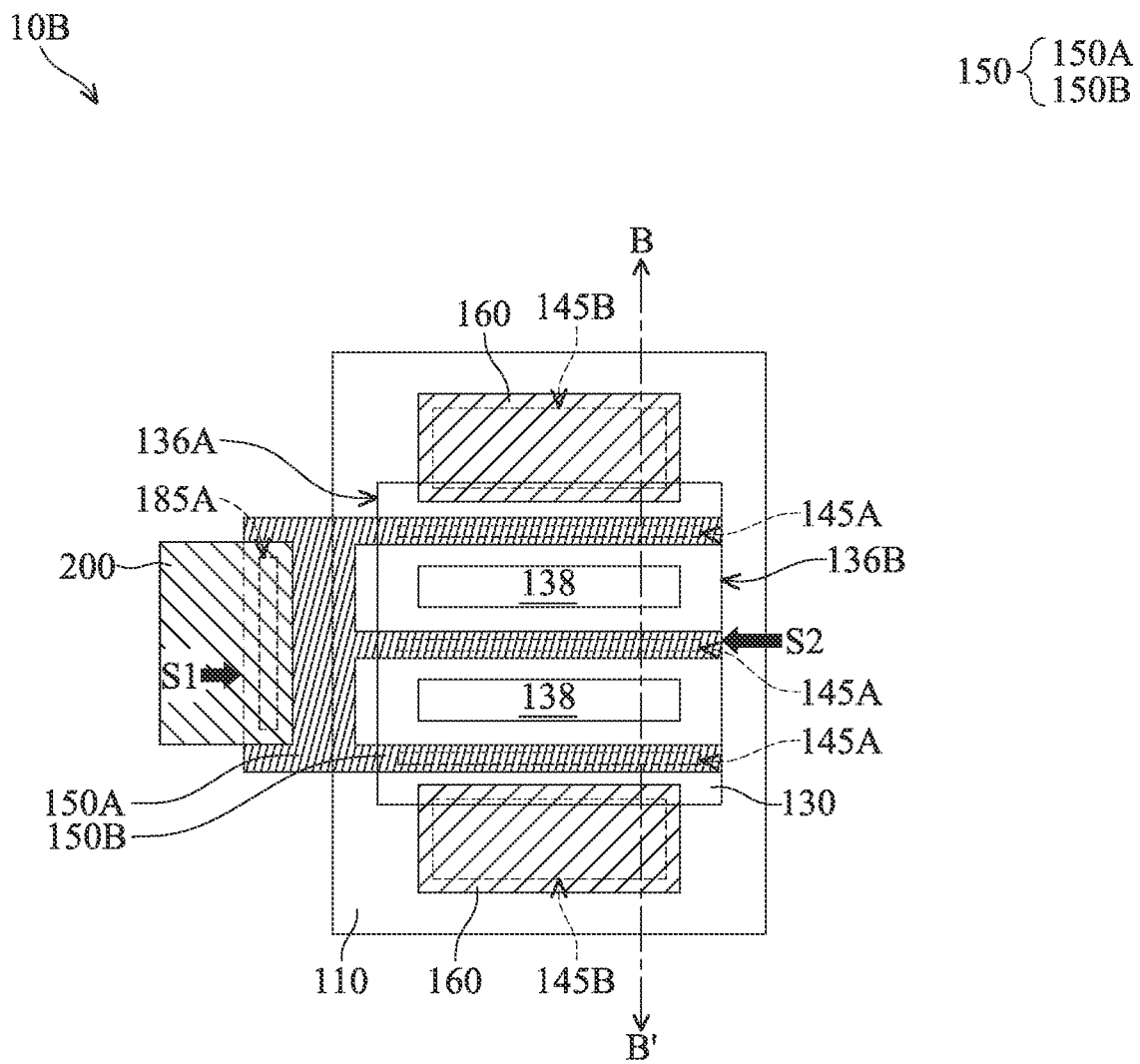
FIGS. 1B and 1D are respectively a top view and a cross-sectional view of a heterojunction bipolar transistor, according to some embodiments of the present disclosure.
Figure 1C:
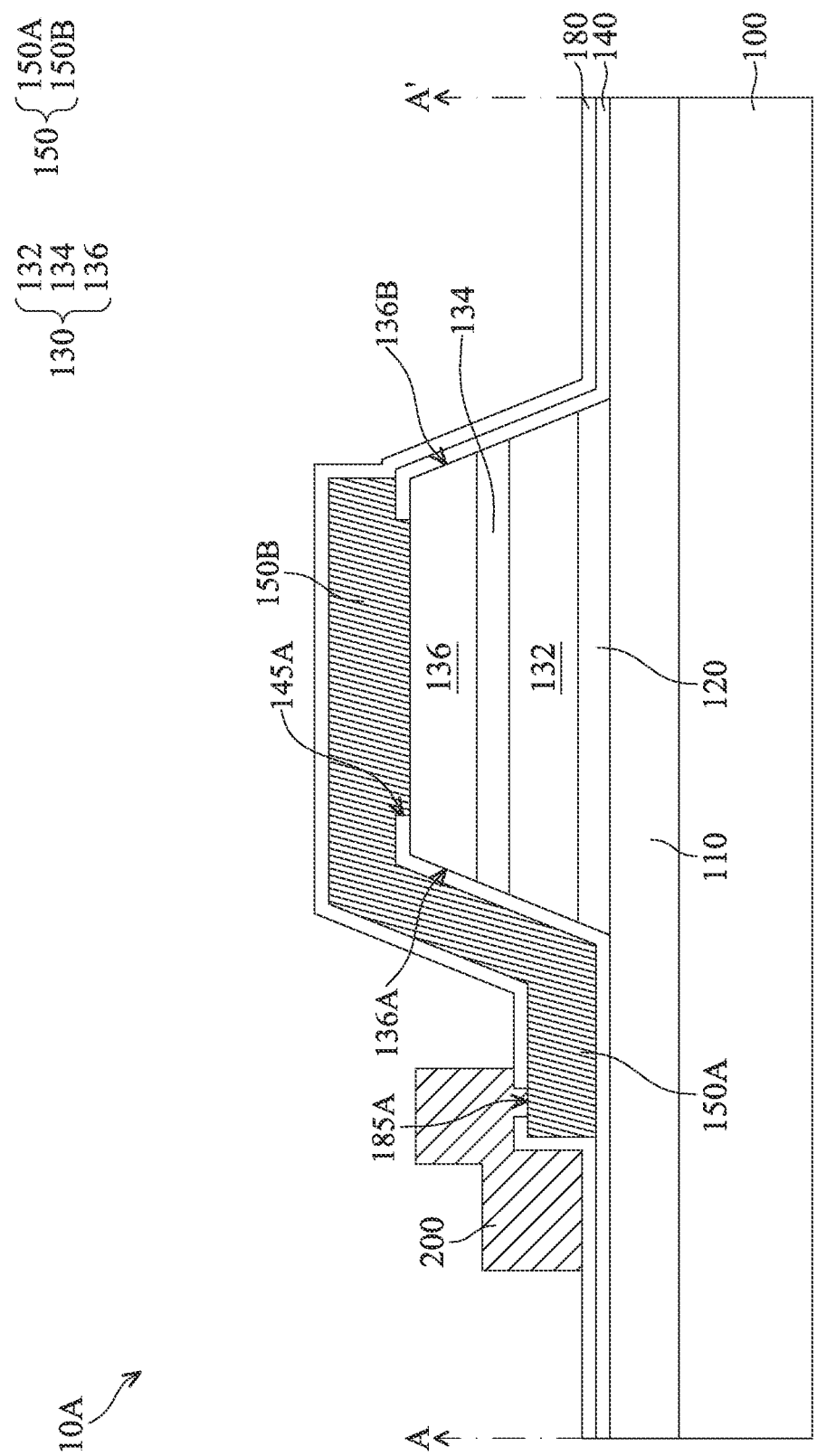

FIGS. 1A and 1C are respectively a top view and a cross-sectional view of a heterojunction bipolar transistor 10A, according to some embodiments of the present disclosure. It is worth noted that FIG. 1C is the cross-sectional view obtained from a line A-A' of FIG. 1A.

Referring to FIG. 1, the heterojunction bipolar transistor 10A may include a substrate 100, a bottom sub-collector layer 110, an etch stop layer (ESL) 120, a base mesa 130, an emitter layer 138, a first dielectric film 140, via holes 145A, a base electrode 150, collector electrodes 160, a second dielectric film 180, a via hole 185A, a first conductive layer 200, via holes 215A, and a second conductive layer 220. The bottom sub-collector layer 110 may also be known as a collector mesa. The base mesa 130 may include an upper sub-collector layer 132, a collector layer 134, and a base layer 136. The bottom sub-collector layer 110, the etch stop layer 120, the upper sub-collector layer 132, the collector layer 134, the base layer 136, and the emitter layer 138 may be formed on the substrate 100 by an epitaxial process and thus may be collectively considered as an epitaxial structure. The base layer 136 may include a first side (or edge) 136A and a second side (or edge) 136B. Moreover, the base electrode 150 may include a connection portion 150A and a plurality of finger portions 150B.

Referring to FIGS. 1A and 1C, the substrate 100 may also be, for example, a wafer or a chip, but the present disclosure is not limited thereto. In some embodiments, the substrate 100 may be a semiconductor substrate, for example, silicon (Si) substrate. Furthermore, in some embodiments, the semiconductor substrate may also be an elemental semiconductor including germanium (Ge), a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof.

In some embodiments, the substrate 100 may be an n-type or a p-type conductive type. In some embodiments, the n-type dopants may include phosphorus (P), arsenic (As), silicon (Si), selenium (Se), and tellurium (Te), while the p-type dopants may include boron (B), indium (In), aluminum (Al), carbon (C), magnesium (Mg), zinc (Zn), calcium (Ca), beryllium (Be), strontium (Sr), barium (Ba), and radium (Ra).

In some embodiments, the substrate 100 may include isolation structures (not shown) to define active regions and to electrically isolate active region elements within or above the substrate 100.

As mentioned previously, material films of the bottom sub-collector layer 110, the etch stop layer 120, the upper sub-collector layer 132, the collector layer 134, the base layer 136, and the emitter layer 138 may be epitaxially grown on the substrate 100. The epitaxial process may include metal organic chemical vapor deposition (MOCVD), hydride vapor phase epitaxy (HVPE), molecular beam epitaxy (MBE), chemical vapor deposition (CVD), the like, or a combination thereof. After the epitaxial growth process, the material films may be patterned into the respective mesa areas. For example, the emitter layer 138 may first be patterned into an emitter mesa. Next, the base layer 136, the collector layer 134, and the upper sub-collector layer 132 may be patterned into the base mesa 130. After that, an implantation process may be performed on the bottom sub-collector layer 110 to form into active areas and insulated areas. Each active area of the bottom sub-collector layer 110 may be defined as a collector mesa, which may be isolated from each other by the insulated areas.

In some embodiments, the patterning process may include photolithography process (for example, photoresist coating, soft baking, exposure, post-exposure baking (such as rinsing and drying), development, the like, or a combination thereof) and etching process (for example, wet etching process, dry etching process, the like, or a combination thereof), the like, or a combination thereof. For example, the base mesa 130 may have a straight sidewall when the dry etching process is used, and may have a tapered sidewall when the wet etching process is used.

Still referring to FIGS. 1A and 1C, the bottom sub-collector layer 110 may be disposed on the substrate 100. According to some embodiments of the present disclosure, as stated earlier, the bottom sub-collector layer 110 may be implanted to define the collector mesa, and may form an ohmic contact with the subsequently formed collector electrodes 160. For illustrative purpose, the top view of the heterojunction bipolar transistor 10A only shows one of the active areas of the bottom sub-collector layer 110. In some embodiments, the bottom sub-collector layer 110 may be p-type or n-type conductive type. Materials of the bottom sub-collector layer 110 may include III-V semiconductor compounds, such as gallium nitride, aluminum gallium nitride (AlGaN), aluminum nitride (AlN), gallium arsenide, aluminum gallium arsenic, indium phosphide, indium aluminum arsenide (InAlAs), indium gallium arsenide (InGaAs), the like, or a combination thereof.

In some embodiments, the bottom sub-collector layer 110 may be in-situ doped. The doping concentration of the bottom sub-collector layer 110 may be between $1\times10^{18}$ cm$^{-3}$ and $1\times10^{20}$ cm$^{-3}$, for example, $5\times10^{18}$ cm$^{-3}$. If the doping concentration of the bottom sub-collector layer 110 is too low, the ohmic contact may not be formed between the bottom sub-collector layer 110 and the collector electrodes 160. The thickness of the bottom sub-collector layer 110 may be between 50 nm and 1500 nm, for example, between 100 nm and 1000 nm, or between 100 nm and 800 nm. If the bottom sub-collector layer 110 is too thick, it may be difficult for isolation by implantation. If the bottom sub-collector layer 104A is too thin, the collector resistance may increase.

Referring to FIGS. 1A and 1C, the etch stop layer 120 may be optionally formed on the bottom sub-collector layer 110. According to some embodiments of the present disclosure, the etch stop layer 120 may protect the bottom sub-collector layer 110 from unwanted etching procedures (such as the over-etching of the overlying films), allowing the bottom sub-collector layer 110 to have a uniform thickness. Materials of the etch stop layer 120 may include indium gallium phosphide, indium gallium arsenide, gallium arsenide phosphide, aluminum gallium arsenide, indium aluminum arsenide, gallium antimonide (GaSb), the like, or a combination thereof. In some embodiments, the doping profile of the etch stop layer 120 may be similar to that of the bottom sub-collector layer 110, for example, between $1\times10^{18}$ cm$^{-3}$ and $1\times10^{20}$ cm$^{-3}$. If the doping concentration of the etch stop layer 120 is too high, the dopant may not be activated completely, and the reliability may be compromised. If the doping concentration of the etch stop layer 120 is too low, the collector resistance may increase. The thickness of the etch stop layer 120 may be between 5 nm and 200 nm, for example, between 5 nm and 50 nm. If the etch stop layer 120 is too thick, the collector resistance may increase. If the etch stop layer 120 is too thin, it may not be sufficient to provide the necessary protection for the underlying films.

Still referring to FIGS. 1A and 1C, the upper sub-collector layer 132 may be disposed on the etch stop layer 120 (if present) or the bottom sub-collector layer 110. According to some embodiments of the present disclosure, the upper sub-collector layer 132 defines the bottom of the base mesa 130. Materials of the upper sub-collector layer 132 may be similar to those of the bottom sub-collector layer 110, and the details are not described again herein to avoid repetition. The thickness of the upper sub-collector layer 132 may be between 50 nm and 1500 nm, for example, between 100 nm and 1000 nm, or between 100 nm and 800 nm. In some embodiments, the thickness of the upper sub-collector layer 132 and the thickness of the bottom sub-collector layer 110 are substantially the same. The thickness ratio of the upper sub-collector layer 132 to the bottom sub-collector layer 110 may determine the shape and location of the subsequently formed collector electrodes 160. In some embodiments, the doping concentration of the upper sub-collector layer 132 may be between $1\times10^{18}$ cm$^{-3}$ and $1\times10^{20}$ cm$^{-3}$, for example, $5\times10^{18}$ cm$^{-3}$. In some embodiments, the doping concentrations of the upper sub-collector layer 132 and the bottom sub-collector layer 110 may be the same or different.

It is appreciated that, if the etch stop layer 120 is omitted, the bottom sub-collector layer 110 and the upper sub-collector layer 132 may be formed concurrently using the same materials. Under such condition, the fabrication of the heterojunction bipolar junction 10 may consume less manufacture cost and less process time. The upper sub-collector layer 132 and the bottom sub-collector layer 110 may be collectively referred to as a sub-collector layer.

Referring to FIGS. 1A and 1C, the collector layer 134 may be disposed on the upper sub-collector layer 132. According to some embodiments of the present disclosure, the collector layer 134 is the middle portion of the base mesa 130. Materials of the collector layer 108 may include the III-V semiconductor compound, such as gallium nitride, aluminum gallium nitride, aluminum nitride, gallium arsenide, aluminum gallium arsenide, indium phosphide, indium aluminum arsenide, indium gallium arsenide, gallium antimonide, the like, or a combination thereof. In some embodiments, the collector layer 134 may be n-type conductive type. The doping concentration of the collector layer 134 may be higher than 0 cm$^{-3}$, and may equal to or less than $1\times10^{18}$ cm$^{-3}$, for example, between $1\times10^{14}$ cm$^{-3}$ and $1\times10^{18}$ cm$^{-3}$, between $1\times10^{14}$ cm-3 and $1\times10^{17}$ cm$^{-3}$, between $1\times10^{14}$ cm$^{-3}$ and $3\times10^{17}$ cm$^{-3}$, between $1\times10^{14}$ cm$^{-3}$ and $5\times10^{17}$ cm$^{-3}$, or between $1\times10^{14}$ cm$^{-3}$ and $8\times10^{17}$ cm$^{-3}$. The collector layer 134 may be a multi-layer structure with different doping profiles.

Still referring to FIGS. 1A and 1C, the base layer 136 may be disposed on the collector layer 134. According to some embodiments of the present disclosure, the base layer 136 defines the upper portion of the base mesa 130. As mentioned previously, the base layer 136 may include the first side 136A and the second side 136B. The signal input may be transmitted through the first side 136A and the second side 136B of the base layer 136 to realize the double signal input configuration, thus the base resistance may be reduced. Materials of the base layer 136 may include III-V semiconductor compound, such as gallium nitride, aluminum gallium nitride, aluminum nitride, gallium arsenide, aluminum gallium arsenide, indium phosphide, indium aluminum arsenide, indium gallium arsenide, gallium antimonide, the like, or a combination thereof. In some embodiments, the base layer 136 may be p-type conductive type. The doping concentration of the base layer 136 may be between $1\times10^{18}$ cm$^{-3}$ and $1\times10^{20}$ cm$^{-3}$.

Referring to FIGS. 1A and 1C, the emitter layer 138 may be disposed on the base layer 136. According to some embodiments of the present disclosure, the emitter layer 138 may be considered as the emitter mesa. Materials of the emitter layer 138 may include III-V semiconductor compound, such as gallium nitride, aluminum gallium nitride, aluminum nitride, gallium arsenide, aluminum gallium arsenide, indium phosphide, indium aluminum arsenide, indium gallium arsenide, the like, or a combination thereof. In some embodiments, the emitter layer 138 may be n-type conductivity type. In some embodiments, the emitter layer 138 may be a single-layer structure made of n-type indium gallium phosphide. In some embodiments, the emitter layer 138 may be a multi-layer structure made of n-type indium gallium phosphide at the bottom and gallium arsenide at the top (not shown). It is appreciated that the materials of the emitter layer 138 and the materials of the base layer 136 have different band gaps. Therefore, a heterojunction may be formed at the interface between the emitter layer 138 and the base layer 136.

Still referring to FIGS. 1A and 1C, the first dielectric film 140 may be conformally formed on the substrate 100 and the epitaxial structure (such as the bottom sub-collector layer 110, the etch stop layer 120, the upper sub-collector layer 132, the collector layer 134, the base layer 136, and the emitter layer 138). In some embodiments, the first dielectric film 140 covers the substrate 100 and the epitaxial structure in order to provide mechanical protection and electrical insulation for the underlying structures. Materials of the first dielectric film 140 may include silicon nitride (SiN), aluminum nitride, silicon oxide (SiO), aluminum oxide (AlO), the like, or a combination thereof. The first dielectric film 140 may be formed by chemical vapor deposition, high-density plasma chemical vapor deposition (HDP-CVD), plasma-enhanced chemical vapor deposition (PECVD), flowable chemical vapor deposition (FCVD), sub-atmospheric chemical vapor deposition (SACVD), atomic layer deposition (ALD), the like, or a combination thereof.

Referring to FIGS. 1A and 1C, the via holes 145A may be formed in the first dielectric film 140. According to some embodiments of the present disclosure, the via holes 145A may be viewed as an opening within the first dielectric film 140, allowing the element below and above the first dielectric film 140 to establish electrical connection. In a specific embodiment of the present disclosure, the via holes 145A allow the base layer 136 and the plurality of finger portions 150B to be electrically connected for signal transmission. From the top view, the via holes 145A may be arranged on the base layer 136 of the base mesa 130. The via holes 145A may be formed by patterning the first dielectric film 140, which include any suitable photolithography process and etching process mentioned above. Moreover, via holes 145B (shown in FIGS. 1B and 1D) may also be formed in the first dielectric film 140, and may be arranged on the bottom sub-collector layer 110 to establish electrical connection between the bottom sub-collector layer 110 and the subsequently formed collector electrodes 160.

Still referring to FIGS. 1A and 1C, the base electrode 150 may be disposed on the first dielectric film 140. According to some embodiments of the present disclosure, the base electrode 150 may function as a base terminal of the heterojunction bipolar transistor 10A. As mentioned previously, the base electrode 150 may include the connection portion 150A and the plurality of finger portions 150B. The term "connection portion" may hereafter be referred to as a single element directly linking all the finger portions 150B. In some embodiments, the connection portion 150A may be located on the substrate 100 at the first side 136A of the base layer 136. The plurality of finger portions 150B may be extended from the connection portion 150A toward the second side 136B of the base layer 136. In a specific embodiment of the present disclosure, the plurality of finger portions 150B climb onto the base mesa 130. According to some embodiments of the present disclosure, the lengthwise direction of the plurality of finger portions 150B is substantially perpendicular to the first side 136A (or the second side 136B) of the base layer 136.

The plurality of finger portions 150B of the base electrode 150 may be disposed corresponding to the via holes 145A, respectively. It is appreciated that the first width W1 of each finger portion 150B needs to be larger than the critical dimension of each via hole 145A. If the first width W1 is smaller than the critical dimension each via hole 145A, then the via holes 145A may not be entirely covered, other subsequently formed elements may inadvertently flow into the uncovered space of the via holes 145A, and may cause short circuitry between said elements and the underlying epitaxial structure.

Materials of the base electrode 150 may include metals, such as cobalt (Co), ruthenium (Ru), aluminum, tungsten (W), copper (Cu), titanium (Ti), tantalum (Ta), silver (Ag), gold (Au), platinum (Pt), nickel (Ni), palladium (Pd), zinc, chromium (Cr), molybdenum (Mo), niobium (Nb), the like, a combination thereof, or a multiple layer thereof. The base electrode may be formed by chemical vapor deposition (CVD), atomic layer deposition (ALD), physical vapor deposition (PVD), evaporation, plating, sputtering, the like, or a combination thereof, but the present disclosure is not limited thereto.

Referring to FIGS. 1A and 1C, the collector electrodes 160 may be disposed on the first dielectric film 140. According to some embodiments of the present disclosure, the collector electrodes 160 may function as a collector terminal of the heterojunction bipolar transistor 10A. In some embodiments, the collector electrodes 160 may be arranged on the top surface of bottom sub-collector layer 110 (or on the collector mesa over the substrate 100). The collector electrodes 160 may be disposed corresponding to the via holes 145B (shown in FIGS. 1B and 1D) in the first dielectric film 140. As mentioned previously, the collector electrodes 160 may be electrically connected to the bottom sub-collector layer 110 through the via holes 145B, and the ohmic contact is formed between the collector electrodes 160 and the bottom sub-collector layer 110. The materials and the formation of the collector electrodes 160 are similar to those of the base electrode 150, and the details are not described again herein to avoid repetition.

Still referring to FIGS. 1A and 1C, the second dielectric film 180 may be conformally formed on the first dielectric film 140, the base electrode 150, and the collector electrodes 160. In some embodiments, the second dielectric film 180 covers the first dielectric film 140, the base electrode 150, and the collector electrodes 160 in order to provide mechanical protection and electrical insulation for the underlying structures. Materials of the second dielectric film 180 may include silicon oxide, silicon nitride, silicon carbide, silicon oxynitride (SiON), silicon oxynitrocarbide ($SiO_xN_yC_{1-x-y}$, wherein x and y are in a range from 0 to 1), tetra ethyl ortho silicate (TEOS), undoped silicate glass, or doped silicon oxide (such as boron-doped phosphosilicate glass (BPSG), fused silica glass (FSG), phosphosilicate glass (PSG), boron doped silicon glass (BSG)), polyimide (PI), polyamide (PA), low-k dielectric materials, the like, or a combination thereof. It is appreciated that, using dielectric materials with lower dielectric constant may further reduce the parasitic capacitance. The formation of the second dielectric film 180 is similar to that of the first dielectric film 140, and the details are not described again herein to avoid repetition.

Referring to FIGS. 1A and 1C, the via hole 185A and the via holes 185C may be formed in the second dielectric film 180. According to some embodiments of the present disclosure, the via hole 185A and the via holes 185C may be viewed as openings within the second dielectric film 180, allowing the elements below and above the second dielectric film 180 to establish electrical connection. In some embodiments, the via hole 185A and the via holes 185C are laterally spaced away from the base layer 136. In a specific embodiment of the present disclosure, the via hole 185A allows the connection portion 150A of the base electrode 150 and the subsequently formed first conductive layer 200 to be electrically connected for signal transmission. From the top view, the via hole 185A may be arranged on the connection portion 150A of the base electrode 150. According to some embodiments of the present disclosure, the via hole 185A may be extended in a direction perpendicular to the lengthwise direction of the plurality of finger portions 150B. In a specific embodiment of the present disclosure, the via holes 185C allow the collector electrodes 160 and the subsequently formed first conductive layer 200 to be electrically connected for signal transmission. In some embodiments, the via holes 185C may be arranged on the collector electrodes 160. The via hole 185A and the via holes 185C may be formed by patterning the second dielectric film 180, which include any suitable photolithography process and etching process mentioned above.

Still referring to FIGS. 1A and 1C, the first conductive layer 200 may be disposed on the second dielectric film 180. According to some embodiments of the present disclosure, the first conductive layer 200 may function as metal lines for electrical connection. Moreover, the first conductive layer 200 may also be used to constitute capacitors, inductors, resistors, and other passive components (not shown). In some embodiments, the first conductive layer 200 may be arranged on the top surface of the connection portion 150A of the base electrode 150 and the top surface of the collector electrodes 160. The first conductive layer 200 may be disposed corresponding to the via hole 185A and the via holes 185C in the second dielectric film 180. As mentioned previously, the first conductive layer 200 may be electrically connected to the base electrode 150 and the collector electrodes 160 through the via hole 185A and the via holes 185C, respectively. It is worth noted that the portions of the first conductive layer 200 above the base electrode 150 and the collector electrodes 160 may be further extended outward, in order to serve as metal lines for signal transmission. The materials and the formation of the first conductive layer 200 are similar to those of the base electrode 150, and the details are not described again herein to avoid repetition.

In some embodiments, another dielectric film (not shown) may be formed on the second dielectric film 180 and first conductive layer 200. In some embodiments, the dielectric film covers the second dielectric film 180 and the first conductive layer 200 in order to provide mechanical protection and electrical insulation for the underlying structures. The materials and the formation of the dielectric film are similar to those of the second dielectric film 180, and the details are not described again herein to avoid repetition.

Referring to FIGS. 1A and 1C, the via holes 215A may be formed in the dielectric film. According to some embodiments of the present disclosure, the via holes 215A may be viewed as openings within the dielectric film, allowing the elements below and above the dielectric film to establish electrical connection. In a specific embodiment of the present disclosure, the via holes 215A allow the first conductive layer 200 and the subsequently formed second conductive layer 220 to be electrically connected for coupling the collector electrodes 160. The via holes 215A may be arranged on the first conductive layer 200. Specifically, the via holes 215 are located on the portions of the first conductive layer 200 in electrical connection with the collector electrodes 160, and positioned outside the collector mesa. The via holes 215A may be formed by patterning the dielectric film, which may include any suitable photolithography process and etching process mentioned above.

Still referring to FIGS. 1A and 1C, the second conductive layer 220 may be disposed on the dielectric film. According to some embodiments of the present disclosure, the second conductive layer 220 may also function as metal lines for electrical connection. Moreover, the first conductive layer 200 and the second conductive layer 220 may constitute the capacitor structures in other circuitry region (not shown). In some embodiments, the second conductive layer 220 may be arranged on the top surface of the substrate 100 and the top surface of the first conductive layer 200. The second conductive layer 220 may be disposed corresponding to the via holes 215A in the dielectric film disposed between the first conductive layer 200 and the second conductive layer 220. As mentioned previously, the second conductive layer 220 may be electrically connected to the first conductive layer 200 through the via holes 215A. It is worth noted that the second conductive layer 220 may electrically couple the collector electrodes 160 located adjacent to the base mesa 130. The materials and the formation of the second conductive layer 220 are similar to those of the first conductive layer 200, and the details are not described again herein to avoid repetition.

Referring to FIGS. 1A and 1C, when the heterojunction bipolar transistor 10A is in operation, a signal input S1 and a signal input S2 can both be fed into the base layer 136 from first side 136A and the second side 136B, respectively. More specifically, the signal input S1 and the signal input S2 may both be fed to the base electrode 150, thereby reducing the resistance of the base electrode 150. The reduction of the resistance of the base electrode 150 may result in the reduction of the base resistance. In a specific embodiment of the present disclosure, the base resistance is reduced by as much as 20% using the configuration of double signal input. The improved base resistance may allow the stability factor (when k=1) for the maximum stable gain and/or the maximum available gain to prolong toward a higher frequency. As a result, the heterojunction bipolar transistor 10A may exhibit a more superior gain performance under a higher operating frequency.

Figure 1D:
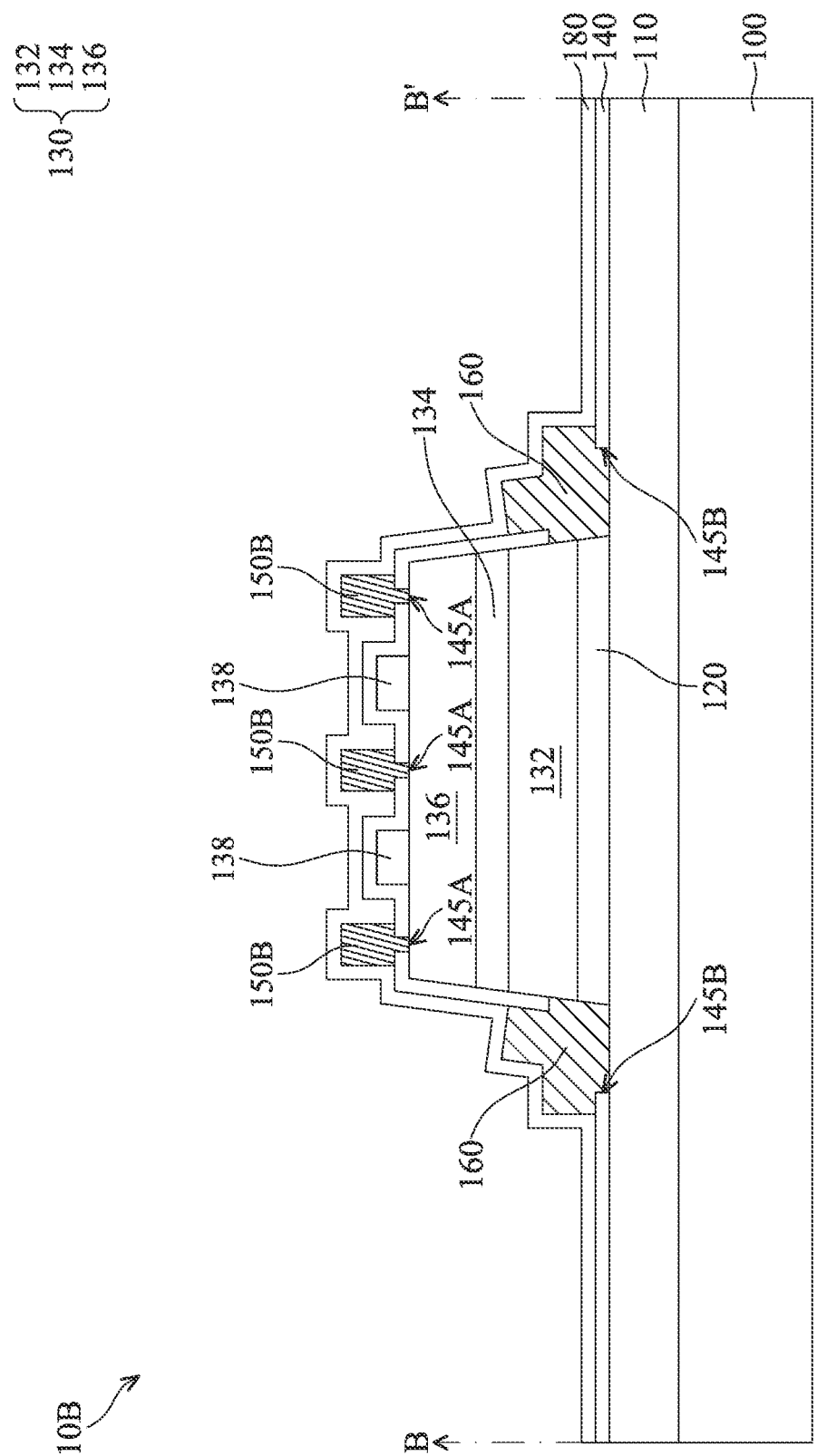

FIGS. 1B and 1D are respectively a top view and a cross-sectional view of a heterojunction bipolar transistor 10B, according to some embodiments of the present disclosure. It is worth noted that FIG. 1D is the cross-sectional view obtained from a line B-B' of FIG. 1B. In comparison with FIGS. 1A and 1C, the collector electrodes 160 of the heterojunction bipolar transistor 10B may extend to the tapered sidewall of the base mesa 130. For illustrated purpose, the via holes 185C, the portions of the first conductive layer 200 electrically connected to the collector electrodes 160, the via holes 215A, and the second conductive layer 220 are omitted. For simplicity, the features of the elements having the same reference numerals are similar to those illustrated in FIGS. 1A and 1C, and the details are not described again herein to avoid repetition.

Referring to FIGS. 1B and 1D, a portion of the via holes 145B and a portion of the collector electrodes 160 may overlap with the base mesa 130. According to some embodiments of the present disclosure, the via holes 145B may be formed in a way that simultaneously exposes the top surface of the bottom sub-collector layer 110 and the sidewall surface of the base mesa 130 (for example, the upper sub-collector layer 132). The subsequently formed collector electrodes 160 may correspond to the via holes 145B. In some embodiments, the collector electrodes 160 may extend from the top surface of the bottom sub-collector layer 110 to the tapered sidewall of the base mesa 130. That is, the collector electrodes 160 may be electrically connected to both the bottom sub-collector layer 110 and the upper sub-collector layer 132 through the fourth via holes 145B disposed in the first dielectric film 140. Similar to the heterojunction bipolar transistors 10A, the signal input S1 and the signal input S2 may be fed into the base layer 136 from first side 136A and the second side 136B, respectively. With the configuration of double signal input, the base resistance may be reduced. The improved base resistance may allow the heterojunction bipolar transistor 10B to exhibit a more superior gain performance under a higher operating frequency.

Figure 2A:
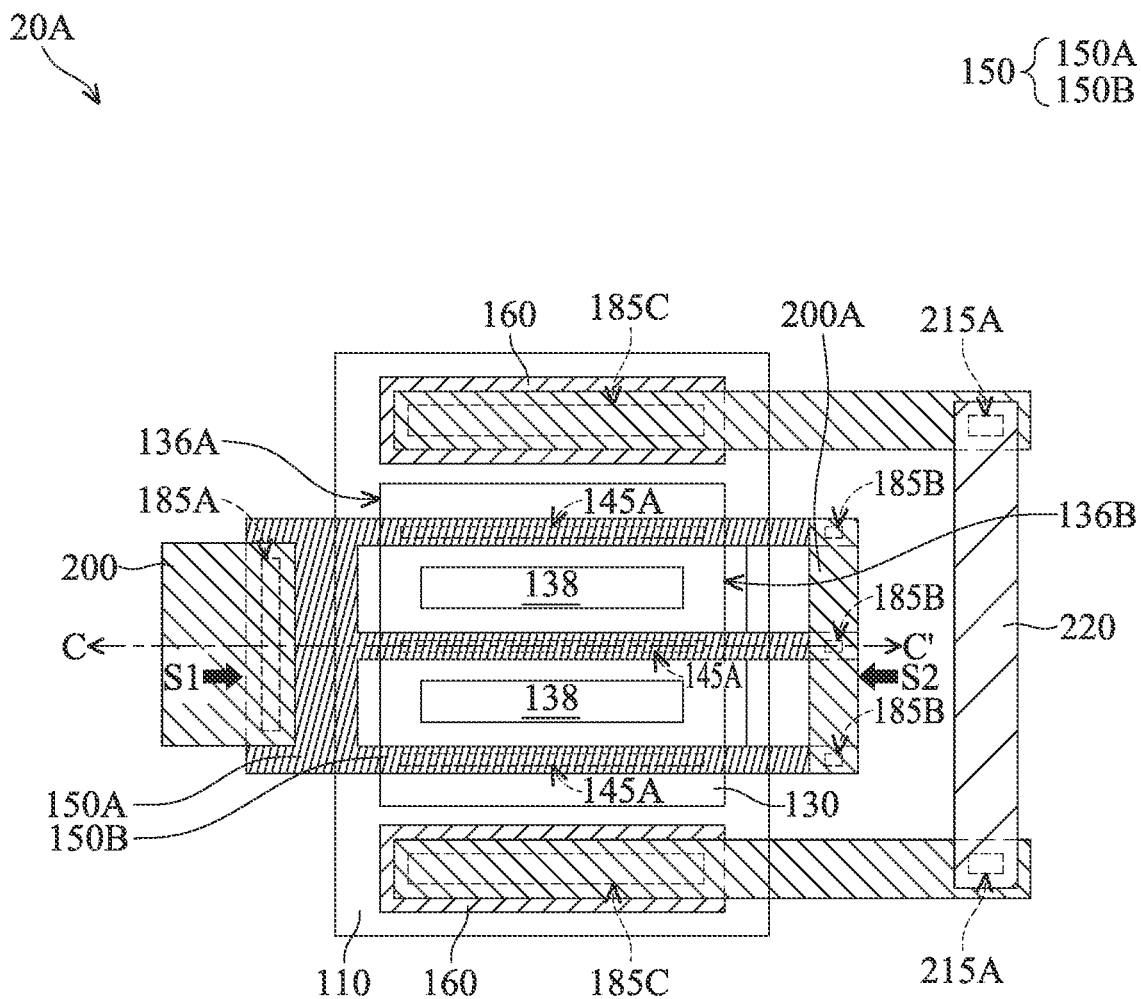
FIGS. 2A and 2B are top views of heterojunction bipolar transistors with different designs, according to some embodiments of the present disclosure.
Figure 2B:
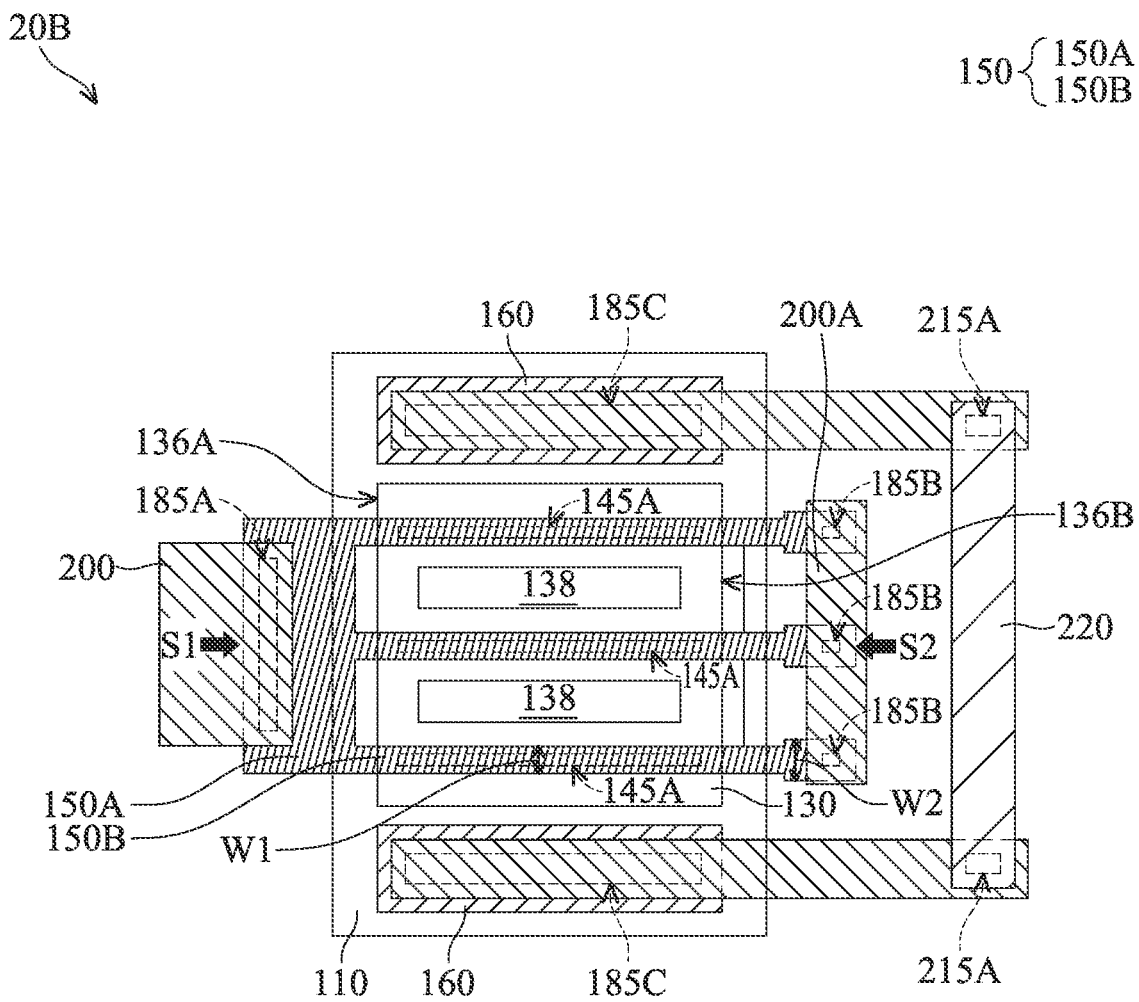

FIGS. 2A and 2B are top views of heterojunction bipolar transistors 20A and 20B with different designs, according to some embodiments of the present disclosure. In comparison with FIGS. 1A, the heterojunction bipolar transistors 20A may include a connection portion 200A of the first conductive layer 200 disposed at the second side 136B of the base layer 136. The connection portion 200A may be electrically connected to the plurality of finger portions 150B through via holes 185B. For simplicity, the features of the elements having the same reference numerals are similar to those illustrated in FIG. 1A, and the details are not described again herein to avoid repetition.

Referring to FIG. 2A, after forming the second dielectric film 180, the via holes 185B may be formed in the second dielectric film 180. The via holes 185B may be arranged on the plurality of finger portions 150B of the base electrode 150. The critical dimension of the via holes 185B from the top view may be similar to that of the via holes 145A within the first dielectric film 140, and the details are not described again herein to avoid repetition. The formation of the via holes 185B may be similar to that of the via hole 185A and the via holes 185C, and the details are not described again herein to avoid repetition.

Still referring to FIG. 2A, similar to the connection portion 150A of the base electrode 150, the connection portion 200A of the first conductive layer 200 may be seen as a single element directly linking all the finger portions 150B. The connection portion 200A may be disposed overlapping the ending segments of the plurality of finger portions 150B. The connection portion 200A of the first conductive layer 200, the via holes 185B, and the base electrode 150 may constitute a closed loop, and the closed loop may encircle the emitter layer 138. In a specific embodiment of the present disclosure, the signal input S1 and the signal input S2 are fed to the base layer 136 through the via hole 185A and the via holes 185B, respectively. With the configuration of double signal input, the base resistance may be reduced. The improved base resistance may allow the heterojunction bipolar transistor 20A to exhibit a more superior gain performance under a higher operating frequency.

Referring to FIG. 2B, the heterojunction bipolar transistors 20B is illustrated. In comparison with FIG. 2A, the plurality of finger portions 150B of the base electrode 150 may include ending segments 150B-E at the second side 136B of the base layer 136. The ending segments 150B-E may be expanded in the widthwise direction of the finger portions 150B. As a result, a second width W2 of the ending segments 150B-E may be larger than the first width W1 of the finger portions 150B. The larger dimension of the ending segments 150B-E may further ensure proper alignment between the via holes 185B and the base electrode 150. Similar to the heterojunction bipolar transistors 20A, the signal input S1 and the signal input S2 may be fed to the base layer 136 through the via hole 185A and the via holes 185B, respectively. With the configuration of double signal input, the base resistance may be reduced. The improved base resistance may allow the heterojunction bipolar transistor 20B to exhibit a more superior gain performance under a higher operating frequency.

Figure 2C:
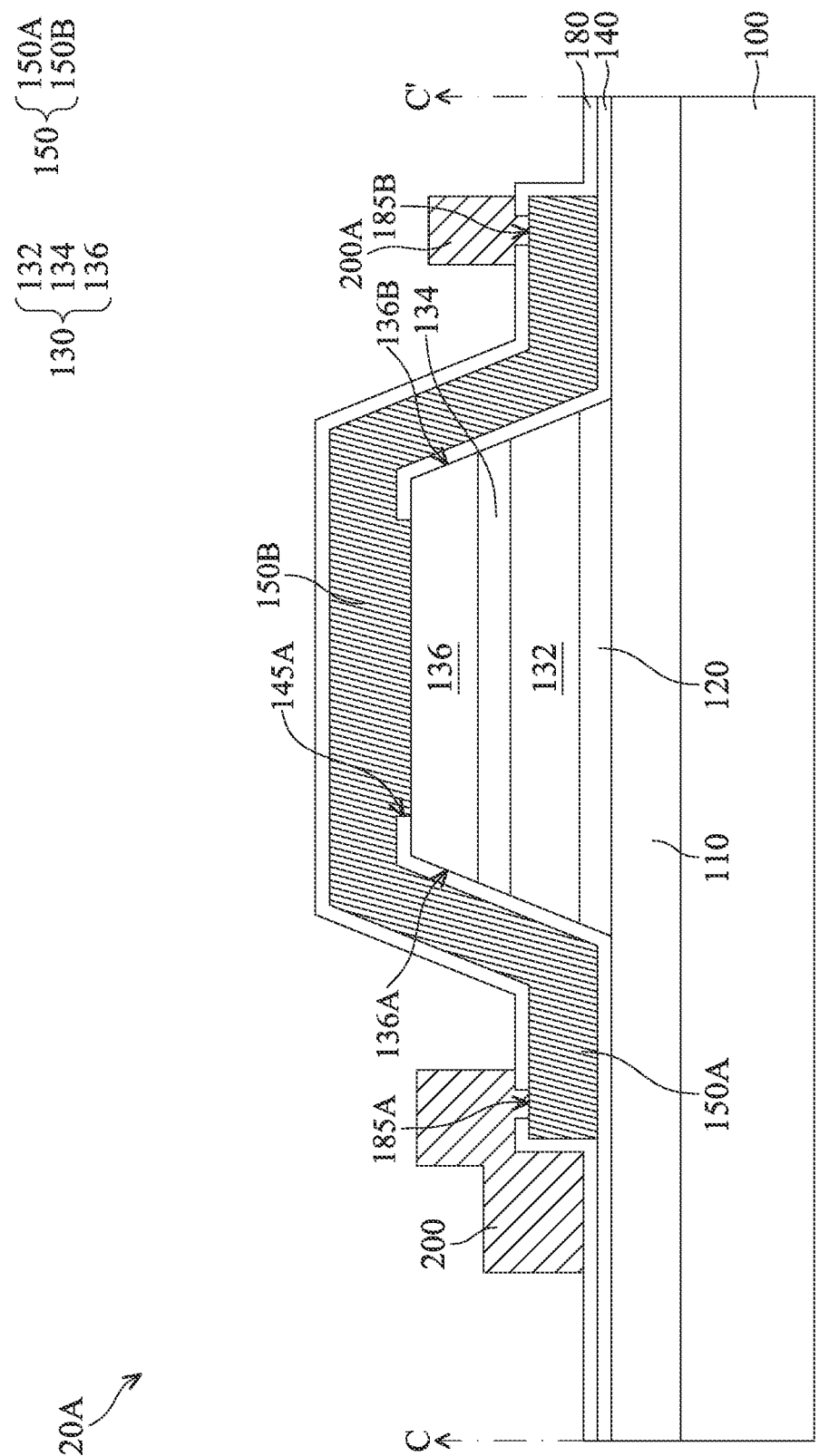
FIG. 2C is a cross-sectional view of the heterojunction bipolar transistor illustrated in FIG. 2A, according to some embodiments of the present disclosure.

FIG. 2C is a cross-sectional view of the heterojunction bipolar transistor 20A illustrated in FIG. 2A, according to some embodiments of the present disclosure. It is worth noted that FIG. 2C is the cross-sectional view obtained from a line C-C' of FIG. 2A. In comparison with FIG. 1C, instead of stopping on the top surface of the base layer 136, the plurality of finger portions 150B of the base electrode 150 may climb off the base mesa 130, then onto the bottom sub-collector layer 110. For simplicity, the features of the elements having the same reference numerals are similar to those illustrated in FIG. 1C, and the details are not described again herein to avoid repetition.

Referring to FIG. 2C, the electrical connection may be established between the connection portion 200A of the first conductive layer 200 and the extended ending segments of the plurality of finger portions 150B of the base electrode 150. As mentioned previously, the signal input S1 and the signal input S2 may be fed to the base layer 136 through the via hole 185A and the via holes 185B, respectively. With the configuration of double signal input, the base resistance may be reduced. Furthermore, since the via hole 185A and the via holes 185B are both spaced apart from the base layer 136, the area of the base mesa 130 may be maintained within a preferable dimension.

In the conventional design, the via hole, which enables the electrical connection between the first conductive layer and the base electrode, may be designed to position on the top surface of the base mesa. Because the arrangement of the via hole needs to accommodate the extension of the first conductive layer toward the perimeter of the base mesa from the outside and the extension of the base electrode toward the perimeter of the base mesa from the inside, the area dimension of the base mesa from the top view must also be adjusted according to the placement of the via hole. This situation poses a severe restriction to the design flexibility of the base mesa. For example, the area of the base mesa may need to be large enough to incorporate the via hole at its top surface. When the area of the base mesa is too large, the contact area between the base mesa and the collector mesa may also increase. The increasing contact area may lead to an excessive parasitic capacitance between the base mesa and the collector mesa, which may compromise the operating performance of the heterojunction bipolar transistor.

In some embodiments, the restriction on the placements between the via hole and the base mesa may be lifted. More specifically, the via hole may be designed to position outside the perimeter of the base mesa, thus the area dimension of the base mesa may no longer need to account for the via hole placement. The area of the base mesa may be decreased, so the via hole may be spaced apart from the base layer of the base mesa. Therefore, due to the reduction of the contact area between the base mesa and the collector mesa, the parasitic capacitance between the base mesa and the collector mesa of the heterojunction bipolar transistor may also be reduced. As a result, the maximum stable gain of the heterojunction bipolar transistor can be improved.

Figure 3:
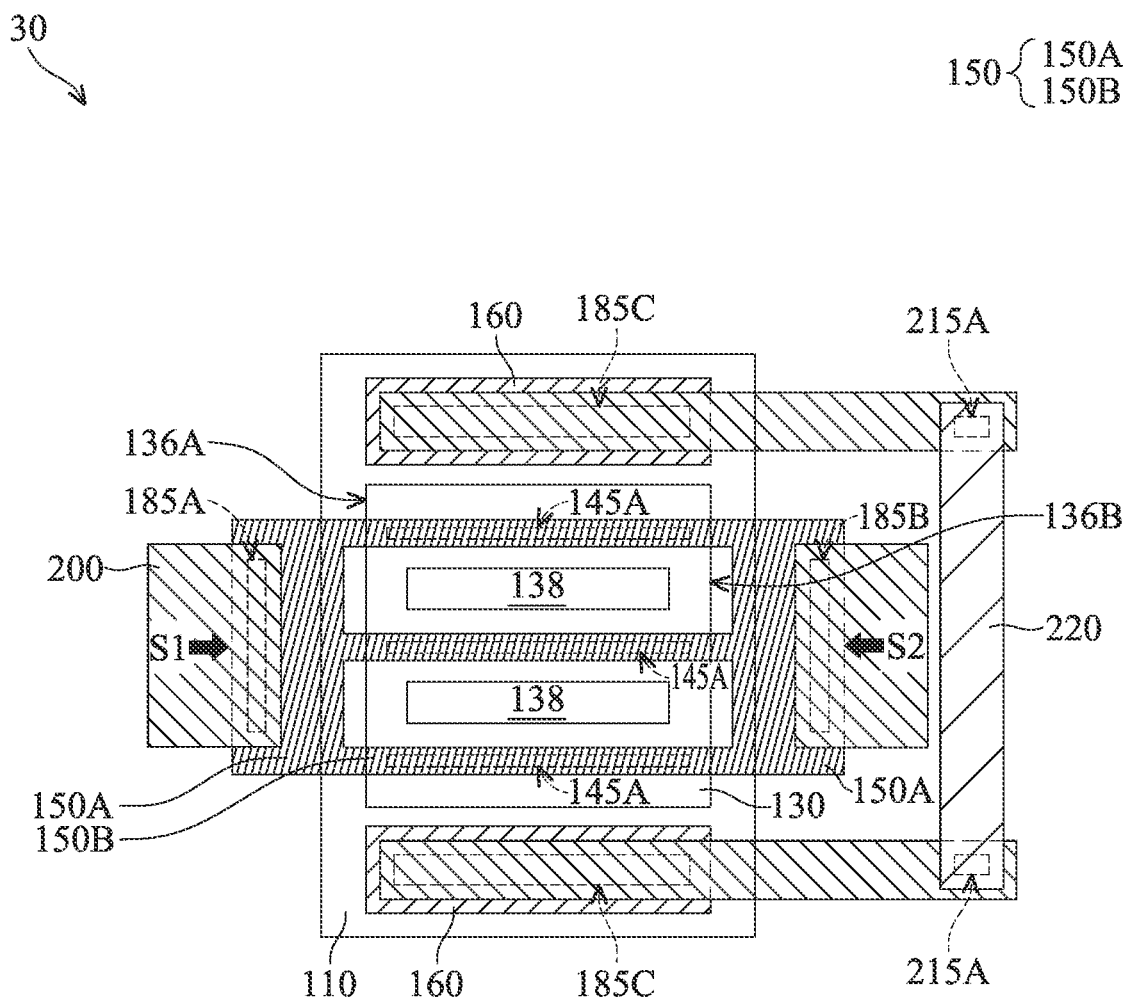
FIG. 3 is a top view of a heterojunction bipolar transistor, according to some embodiments of the present disclosure.

FIG. 3 is a top view of a heterojunction bipolar transistor 30, according to some embodiments of the present disclosure. In comparison with FIG. 2A, the base electrode 150 of the heterojunction bipolar transistor 30 may include an additional connection portion 150A. The two connection portions 150A may be located at the first side 136A and the second side 136B of the base layer 136, respectively. The plurality of finger portions 150B of the base electrode 150 may be directly linked at both the first side 136A and the second side 136B. It is worth noted that the base electrode 150 of the heterojunction bipolar transistor 30 alone may constitute a closed loop that encircles the emitter layer 138. For simplicity, the features of the elements having the same reference numerals are similar to those illustrated in FIG. 2A, and the details are not described again herein to avoid repetition.

Referring to FIG. 3, since the ending segments of the plurality of finger portions 150B are directly linked by the additional connection portion 150A, the original connection portion 200A of the first conductive layer 200 is no longer directly linking the plurality of finger portions 150B, thus the labelling of "200A" is removed. Due to the presence of the additional connection portion 150A with a larger dimension, the via holes 185B may also be adjusted accordingly. Instead of forming multiple via holes 185B of relatively smaller area respectively on the plurality of finger portions 150B, the via holes 185B may be designed into a single element of relatively larger area across the additional connection portion 150A at the second side 136B of the base layer 136. The via hole 185A and the via hole 185B of the heterojunction bipolar transistor 30 may have substantially identical dimension, which allows for the signal input S1 and the signal input S2 to have the same throughput. The signal input S1 and the signal input S2 may be fed to the base layer 136 through the via hole 185A and the via hole 185B, respectively. With the configuration of double signal input, the base resistance may be reduced. The improved base resistance may allow the heterojunction bipolar transistor 30 to exhibit a more superior gain performance under a higher operating frequency.

Figure 4:
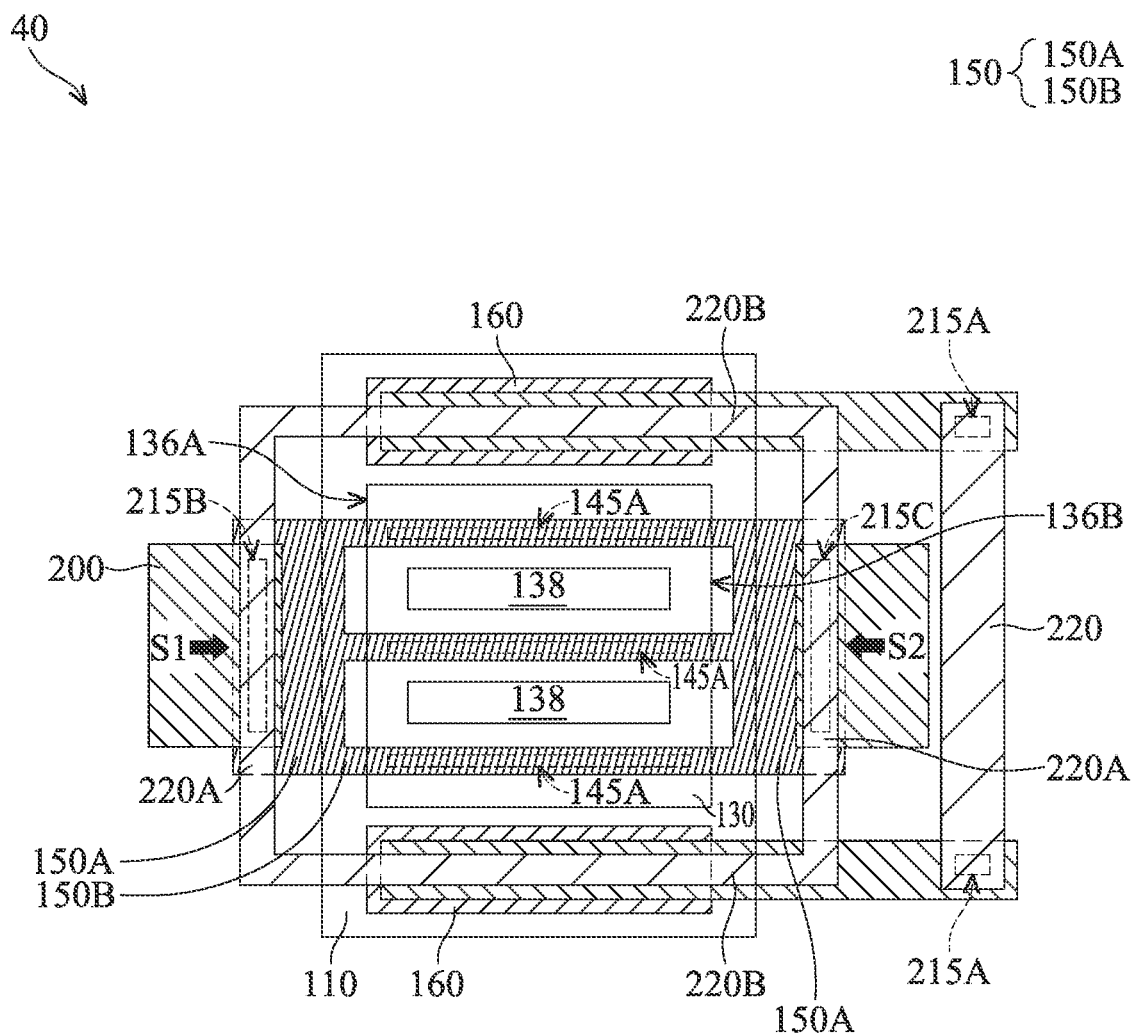
FIG. 4 is a top view of a heterojunction bipolar transistor, according to some embodiments of the present disclosure.

FIG. 4 is a top view of a heterojunction bipolar transistor 40, according to some embodiments of the present disclosure. In comparison with FIG. 3, the second conductive layer 220 may further include an additional portion that laterally encircles the base mesa 130. The additional portion of the second conductive layer 220 may appear to be a closed loop, which partially overlaps the first conductive layer 200. In some embodiments, the closed loop portion of the second conductive layer 220 may be electrically connected to the portions of the first conductive layer 200 at the first side 136A and the second side 136B through a via hole 215B and a via hole 215C, respectively. For simplicity, the features of the elements having the same reference numerals are similar to those illustrated in FIG. 3, and the details are not described again herein to avoid repetition.

Referring to FIG. 4, the closed loop portion of the second conductive layer 220 may extend across both connection portions 150A (at the first side 136A and the second side 136B of the baser layer 136) of the base electrode 150 and both collector electrodes 160 adjacent to the base mesa 130. After forming the dielectric film to be inserted between the first conductive layer 200 and the second conductive layer 220, the via hole 215B and the via hole 215C may be formed in the dielectric film. The via hole 215B and the via hole 215C may be arranged on the portions of the first conductive layer 200 at the first side 136A and the second side 136B of the base layer 136, respectively. The formation of the via hole 215B and the via hole 215C may be similar to that of the via holes 215A, and the details are not described again herein to avoid repetition.

Still referring to FIG. 4, as mentioned previously, the portions of the first conductive layer 200 at the first side 136A and the second side 136B are electrically connected to both the connection portions 150A at the first side 136A and the second side 136B through the via hole 185A and the via hole 185B, respectively (shown in FIG. 3). It is worth noted that the via hole 185A and the via hole 185B are located within the second dielectric film 180 inserted between the base electrode 150 and the first conductive layer 200, and the via hole 215B and the via hole 215C are located within the dielectric film inserted between the first conductive layer 200 and the second conductive layer 220. For simplicity, the via hole 185A and the via hole 185B are not shown in FIG. 4.

Referring to FIG. 4, the segments of the closed loop portion of the second conductive layer 220 at the first side 136A and the second side 136B may be electrically connected to the underlying portions of the first conductive layer 200 through the via hole 215B and the via hole 215C, respectively. According to some embodiments of the present disclosure, the segments of the closed loop portion of the second conductive layer 220 at the first side 136A and the second side 136B may be referred to as conducting portions 220A, and the segments of the closed loop portion of the second conductive layer 220 crossing the collector electrodes 160 may be referred to as transmitting portions 220B. In some embodiments, the conducting portions 220A may conduct the input signals from underlying and/or overlying structures, while the transmitting portions 220B may transmit the input signals.

Still referring to FIG. 4, when the signal input S1 enters the heterojunction bipolar transistor 40, the signal input S1 may be fed to the first side 136A of the base layer 136 by following a first path, and may be fed to the second side 136B of the base layer 136 by following a second path. The first path may allow the signal input S1 to travel through the portion of the first conductive layer 200 at the first side 136A of the base layer 136, the via hole 185A (shown in FIG. 3), the connection portion 150A of the base electrode 150 at the first side 136A of the base layer 136, and the base layer 136. The second path may allow the signal input S1 to travel through the portion of the first conductive layer 200 at the first side 136A of the base layer 136, the via hole 215B, the conducting portion 220A of the second conductive layer 220 at the first side 136A of the base layer 136, the transmitting portions 220B of the second conductive layer 220, the conducting portion 220A of the second conductive layer 220 at the second side 136B of the base layer 136, the via hole 215C, the portion of the first conductive layer 200 at the second side 136B of the base layer 136, the via hole 185B (shown in FIG. 3), the connection portion 150A of the base electrode 150 at the second side 136B of the base layer 136, and the base layer 136. When the signal input S1 is brought in by the metal line structure of the first conductive layer 200, the signal input S1 may travel downward (for example, the first path) to the base layer 136, and/or the signal input S1 may travel upward (for example, the second path) to be carried to the opposing side of the base layer 136 by the second conductive layer 220.

Referring to FIG. 4, it is worth noted that the second path and any of the plurality of finger portions 150B may form another closed loop. In some embodiments, the configuration of the heterojunction bipolar transistor 40 allow the signal input S1 to be transmitted from the base electrode 150 at the first side 136A of the base layer 136 to the base electrode 150 at the second side 136B of the base layer 136 using a path (such as the second path) different from the path through the plurality of finger portions 150B of the base electrode 150, thus the base resistance may be reduced. Similarly, the signal input S2 may also be transmitted from the base electrode 150 at the second side 136B of the base layer 136 to the base electrode 150 at the first side 136A of the base layer 136 using a similar path in a reverse direction to reduce the base resistance. It is also worth noted that when the transmitting portions 220B of the second conductive layer 220 overlaps the collector electrodes 160 and the portions of the first conductive layer 200 above the collector electrodes 160, less circuitry space may be consumed, which is advantageous for the overall device miniaturization. The improved base resistance may allow the heterojunction bipolar transistor 40 to exhibit a more superior gain performance under a higher operating frequency.

Figure 5:
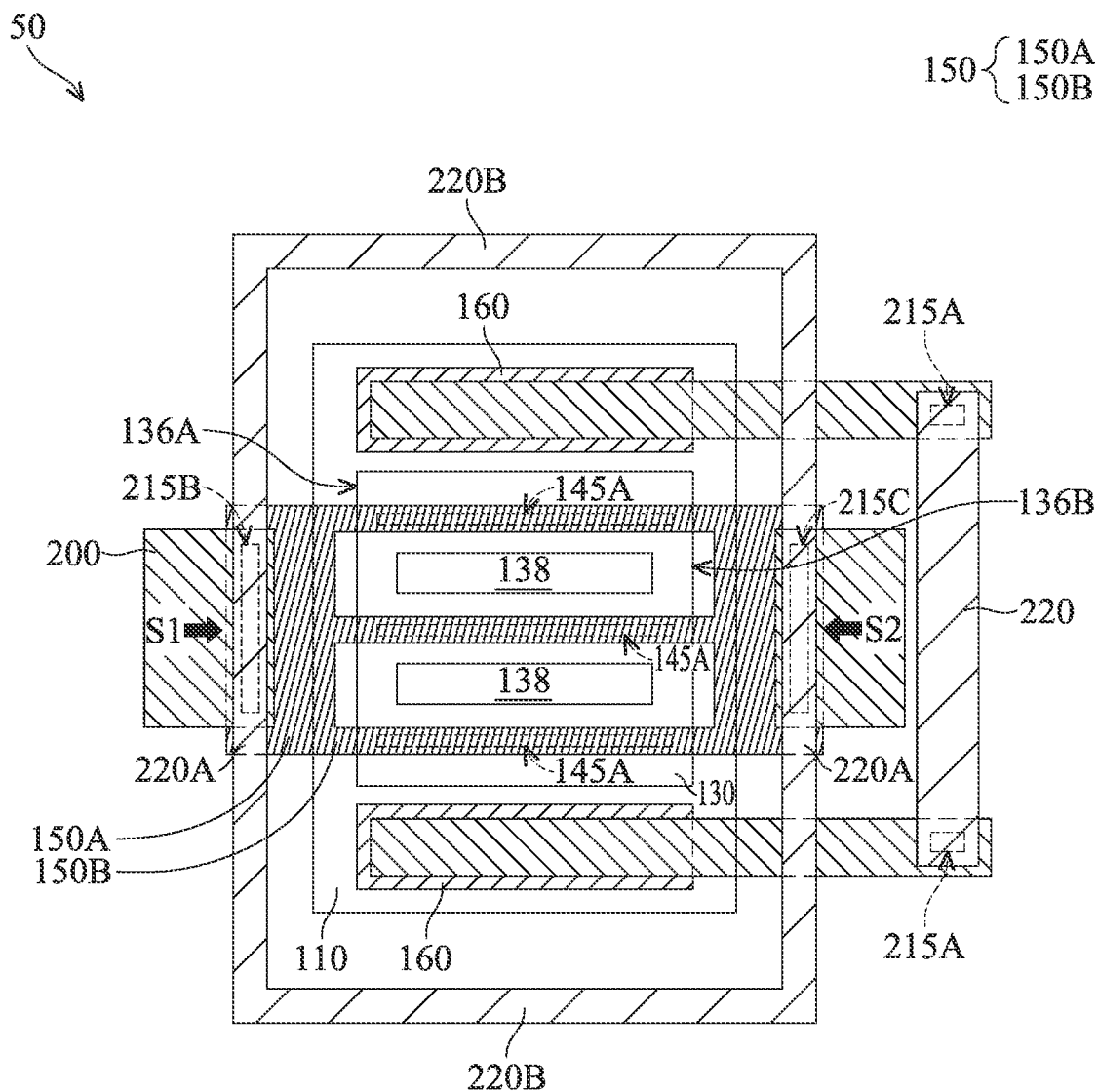
FIG. 5 is a top view of a heterojunction bipolar transistor, according to some embodiments of the present disclosure.

FIG. 5 is a top view of a heterojunction bipolar transistor 50, according to some embodiments of the present disclosure. In comparison with FIG. 4, the transmitting portions 220B of the second conductive layer 220 of the heterojunction bipolar transistor 50 may not overlap with the collector electrodes 160. For simplicity, the features of the elements having the same reference numerals are similar to those illustrated in FIG. 4, and the details are not described again herein to avoid repetition.

Referring to FIG. 5, the transmitting portions 220B of the second conductive layer 220 may be disposed on the insulated areas of the bottom sub-collector layer 110 above the substrate 100. Even though extending the transmitting portions 220B beyond the collector mesa may lose its advantage for device miniaturization, the parasitic capacitance between the second conductive layer 220 and the underlying structures (for example, the collector electrodes 160 and the portions of the first conductive layer 200 above the collector electrodes 160) may be reduced. Moreover, the inventor has discovered that the prolonged second conductive layer 220 may not cause significant inductance rise. Therefore, the heterojunction bipolar transistor 50 may still exhibit a more superior gain performance under a higher operating frequency.

Figure 6A:
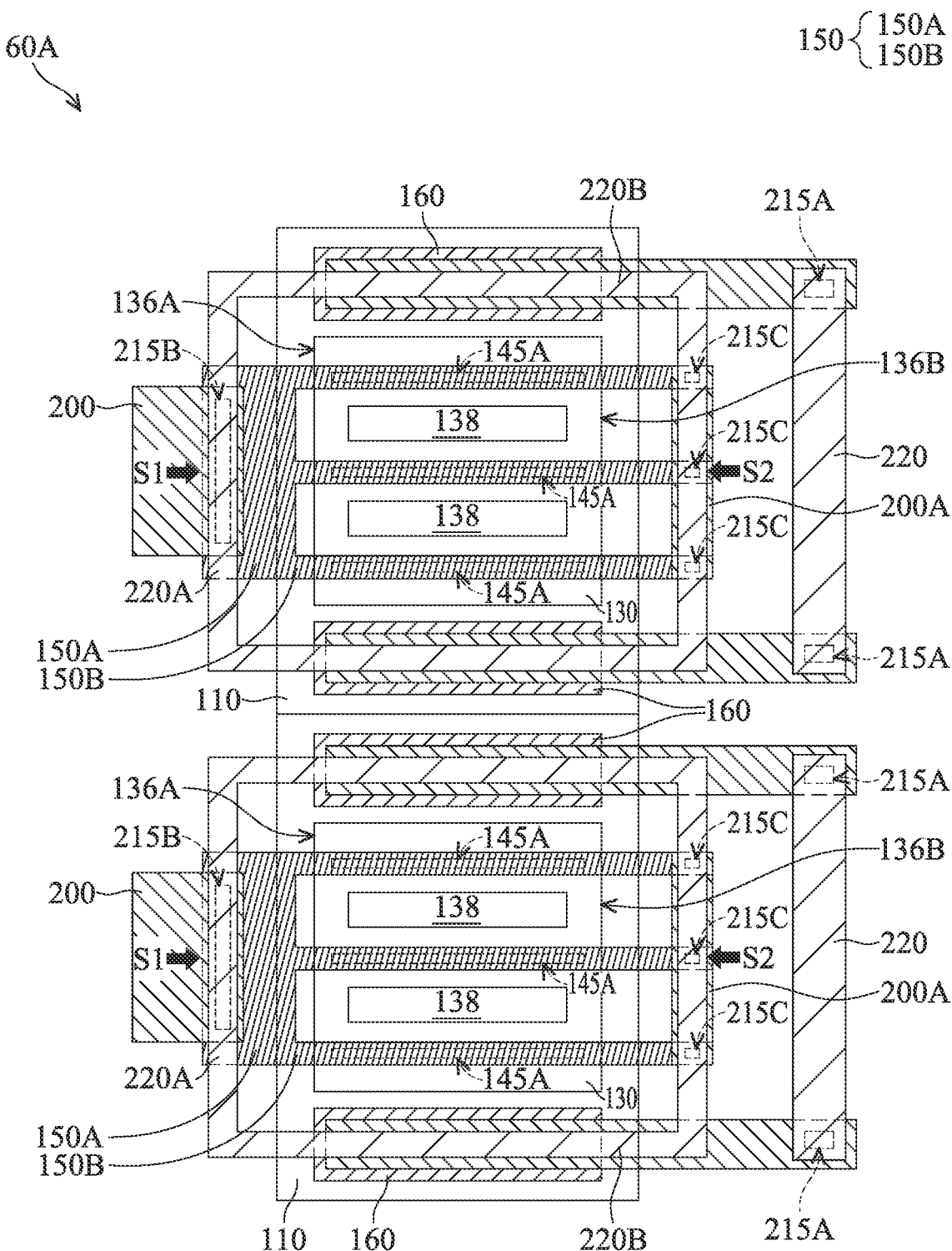
FIGS. 6A-6C are top views of power amplifiers with various designs, according to some embodiments of the present disclosure.
Figure 6B:
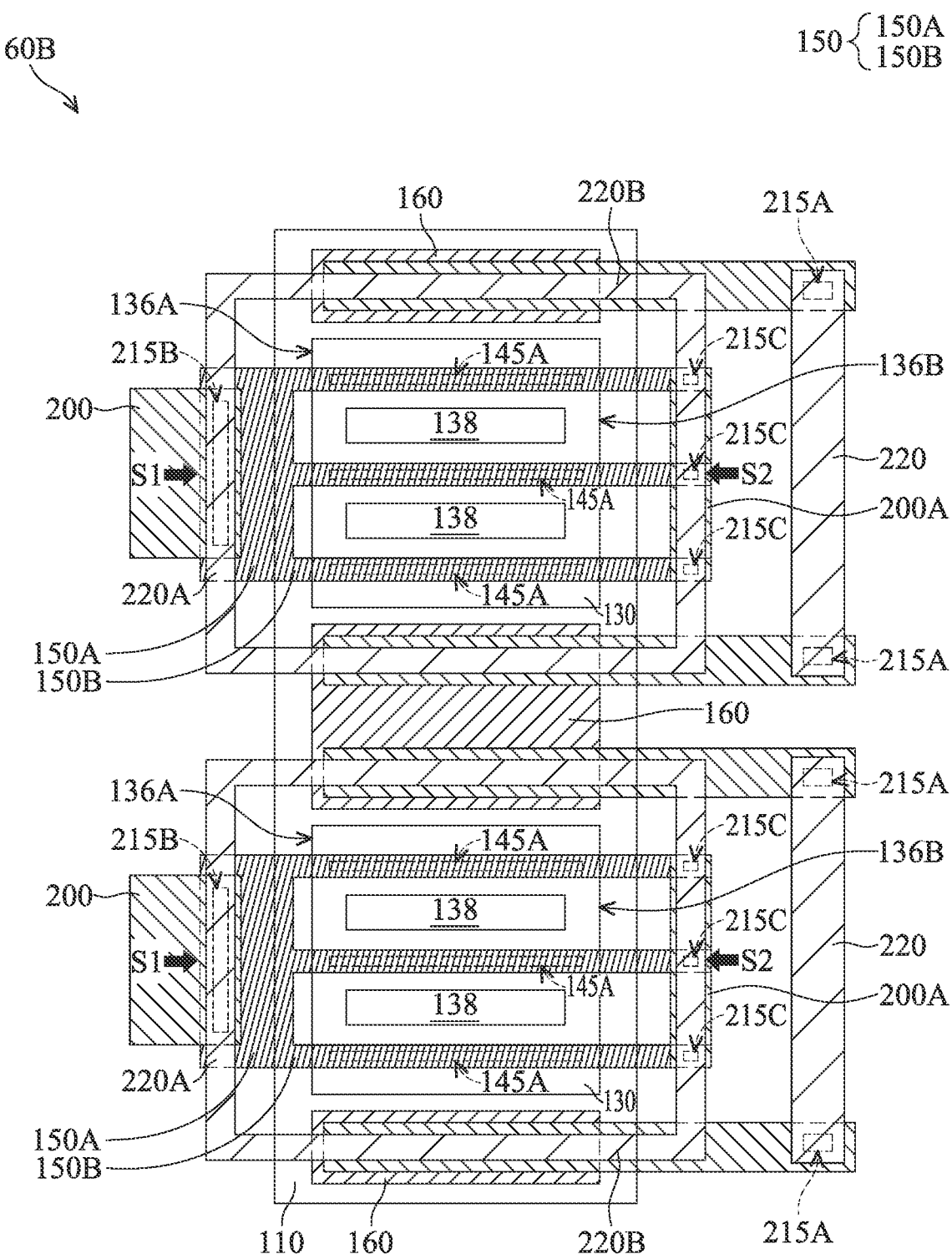
Figure 6C:
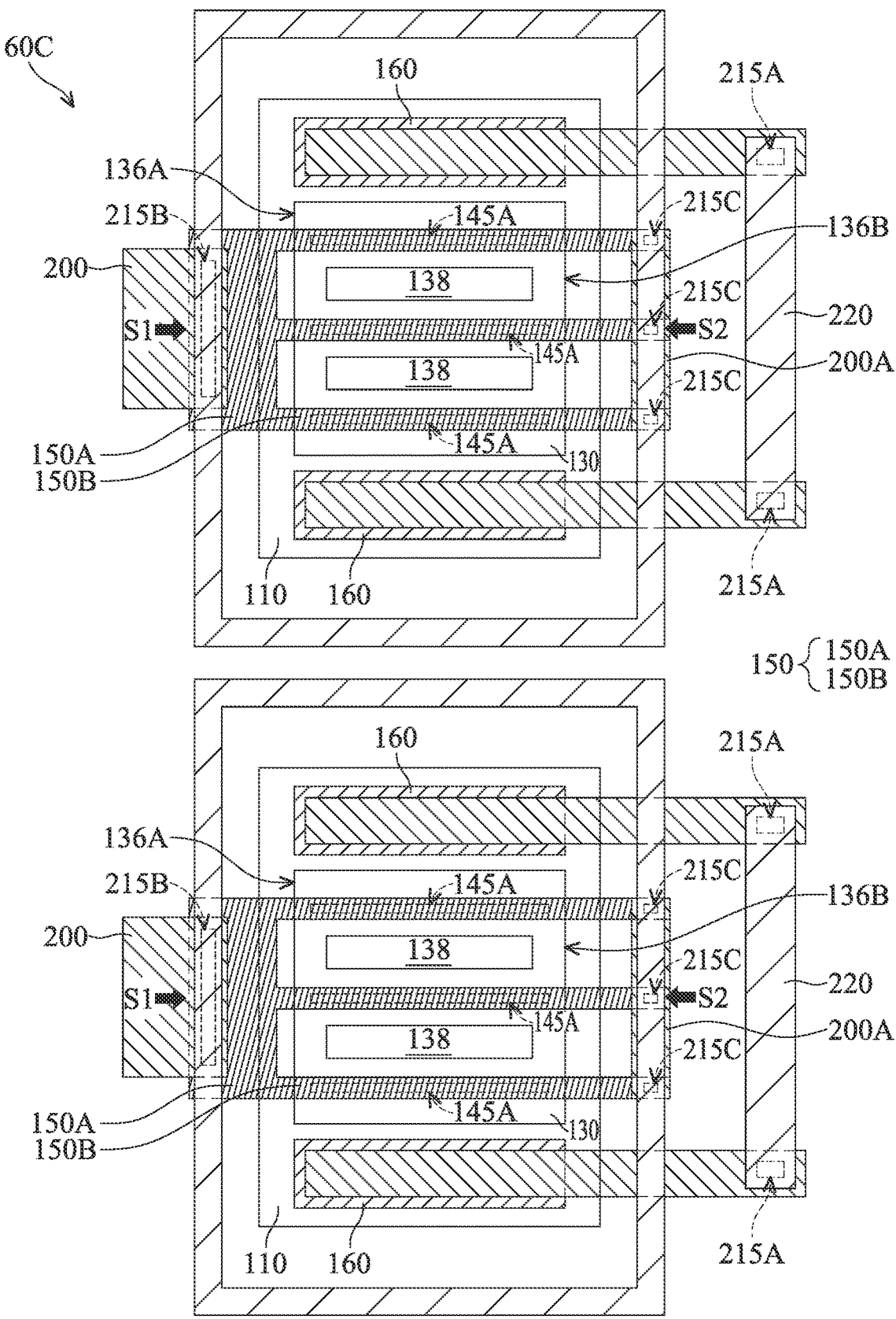

FIGS. 6A-6C are top views of power amplifiers 60A, 60B, and 60C with various designs, according to some embodiments of the present disclosure. In comparison with FIG. 2A, the power amplifiers 60A, 60B, and 60C illustrate two of the heterojunction bipolar transistors 20A placed together. Furthermore, the closed loop portion of the second conductive layer 220 (shown in FIG. 4 or FIG. 5) may also be integrated into the heterojunction bipolar transistors of the power amplifiers 60A, 60B, and 60C. For simplicity, the features of the elements having the same reference numerals are similar to those illustrated in FIG. 2A, and the details are not described again herein to avoid repetition.

Referring to FIG. 6A, the heterojunction bipolar transistors are placed adjacent to each other. Within each heterojunction bipolar transistor, the closed loop portion of the second conductive layer 220 (shown in FIG. 4) may be incorporated to encircle the base mesa 130. As mentioned previously, the closed loop portion of the second conductive layer 220 enable the signal input to transmit between opposite sides of the base electrode 150 using the path different from the path through the plurality of finger portions 150B of the base electrode 150, thus the base resistance may be reduced. Furthermore, when the closed loop portion of the second conductive layer 220 partially overlaps the collector electrodes 160, less circuitry space may be consumed, which is advantageous for the overall device miniaturization. The improved base resistance may allow the power amplifier 60A to exhibit a more superior gain performance under a higher operating frequency.

Referring to FIG. 6B, the power amplifier 60B is illustrated. In comparison with FIG. 6A, the heterojunction bipolar transistors are electrically coupled with each other by sharing one of the collector electrodes 160. Furthermore, the bottom sub-collector layer 110 may be a single structure shared by both heterojunction bipolar transistors of the power amplifier 60B. Although the first conductive layer 200 is illustrated as having two separate portions above the shared collector electrode 160, the first conductive layer 200 may also be modified into one single portion above the shared collector electrode 160, in which the single portion is also shared by both heterojunction bipolar transistors of the power amplifier 60B. As mentioned previously, the closed loop portion of the second conductive layer 220 within each heterojunction bipolar transistor enable the signal input to transmit between opposite sides of the base electrode 150 using the path different from the path through the plurality of finger portions 150B of the base electrode 150, thus the base resistance may be reduced. Furthermore, when the closed loop portion of the second conductive layer 220 partially overlaps the collector electrodes 160, less circuitry space may be consumed, which is advantageous for the overall device miniaturization. The improved base resistance may allow the power amplifier 60B to exhibit a more superior gain performance under a higher operating frequency.

Referring to FIG. 6C, the power amplifier 60C is illustrated. In comparison with FIG. 6A, the closed loop portion of the second conductive layer 220 within each heterojunction bipolar transistor may not overlap with the collector electrodes 160. As mentioned previously, the parasitic capacitance between the second conductive layer 220 and the underlying structures (for example, the collector electrodes 160 and the portions of the first conductive layer 200 above the collector electrodes 160) may be reduced. Even though the closed loop portion of the second conductive layer 220 within each heterojunction bipolar transistor is prolonged, the signal input may still transmit between opposite sides of the base electrode 150 using the path different from the path through the plurality of finger portions 150B of the base electrode 150, thus the base resistance may be reduced. The improved base resistance may allow the power amplifier 60C to exhibit a more superior gain performance under a higher operating frequency.

Figure 7A:
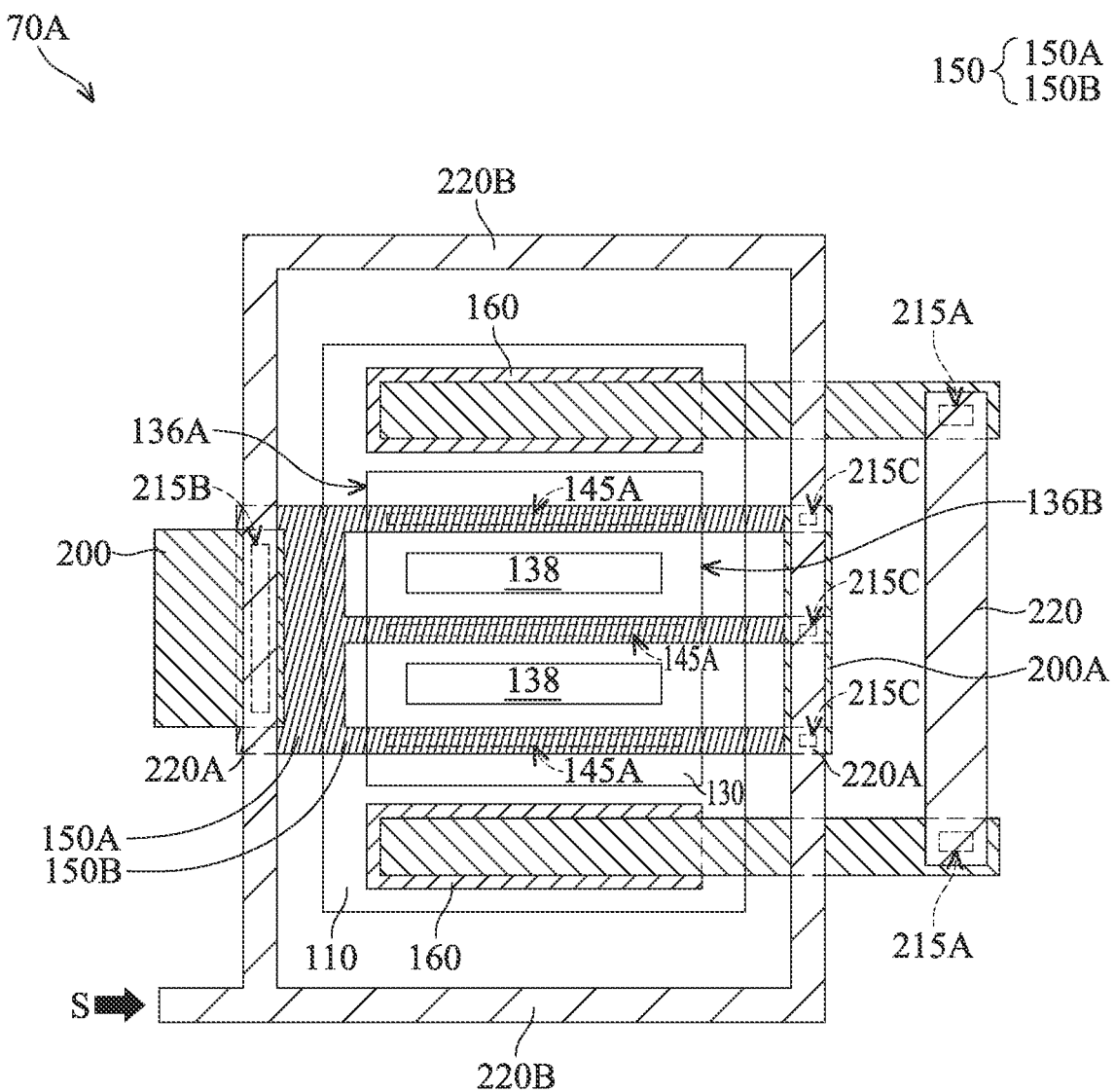
FIGS. 7A and 7B are top views of heterojunction bipolar transistors with different designs, according to some embodiments of the present disclosure.
Figure 7B:
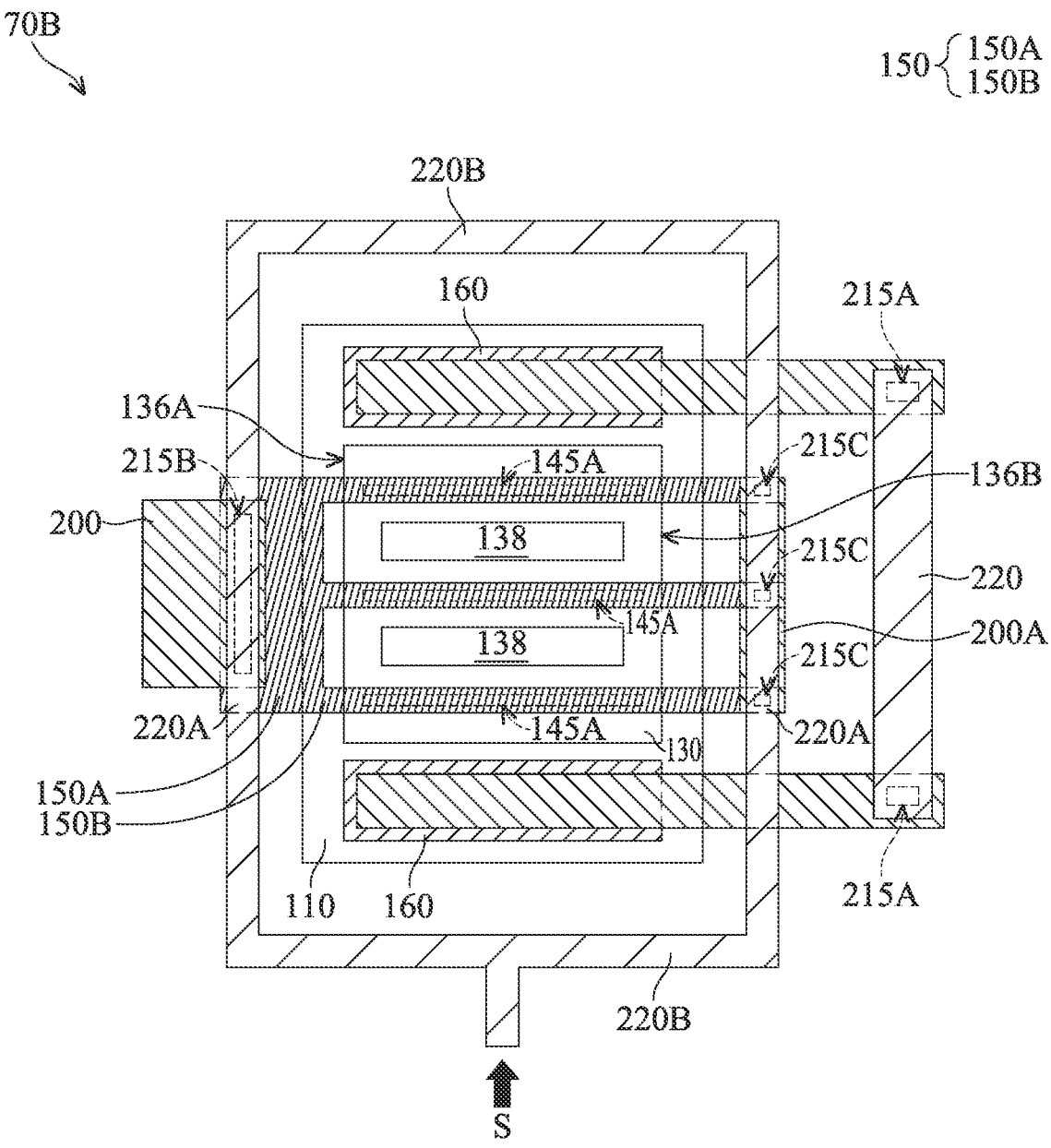

FIGS. 7A and 7B are top views of heterojunction bipolar transistors 70A and 70B with different designs, according to some embodiments of the present disclosure. In comparison with FIG. 2A, the heterojunction bipolar transistors 70A and 70B illustrate a closed loop portion of the second conductive layer 220. Furthermore, in comparison with FIG. 5, there is only one signal input S, which may enter the heterojunction bipolar transistors 70A and 70B through the closed loop portion of the second conductive layer 220. For simplicity, the features of the elements having the same reference numerals are similar to those illustrated in FIG. 2A, and the details are not described again herein to avoid repetition.

Referring to FIG. 7A, the signal input S may be fed into the first side 136A of the base layer 136 by following a third path, and may be fed into the second side 136B of the base layer 136 by following a fourth path. The third path may allow the signal input S to travel through the conducting portions 220A of the second conductive layer 220 at the first side 136A of the base layer 136, the via hole 215B, the portion of the first conductive layer 200 at the first side 136A of the base layer 136, the via hole 185A (shown in FIG. 3), the connection portion 150A of the base electrode 150 at the first side 136A of the base layer 136, and the base layer 136. The fourth path may allow the signal input S to travel through the transmitting portion 220B of the second conductive layer 220, the via hole 215C, the portion of the first conductive layer 200 at the second side 136B of the base layer 136, the via hole 185B (shown in FIG. 3), the connection portion 150A of the base electrode 150 at the second side 136B of the base layer 136, and the base layer 136.

Still referring to FIG. 7A, when the signal input S is brought in by the metal line structure of the second conductive layer 220, the signal input S may reach the first side 136A and the second side 136B of the base layer 136 at almost the same time. Since the third path and the fourth path may travel through substantially the same elements, the phase delay and/or the skin effect may be reduced. The improvement on the phase delay and/or the skin effect is especially notable in higher frequency. The configuration of the heterojunction bipolar transistor 70A may allow the signal input S to be fed into the base layer 136 at both the first side 136A and the second side 136B. With the configuration of double signal input, the base resistance may be reduced. The improved base resistance may allow the heterojunction bipolar transistor 70A to exhibit a more superior gain performance under a higher operating frequency.

Referring to FIG. 7B, the heterojunction bipolar transistor 70B is illustrated. In comparison with FIG. 7A, the signal input S is placed at the center of the transmitting portions 220B of the second conductive layer 220. Such placement may allow the amount of the signal input S transmitting toward the first side 136A and the second side 136B of the base layer 136 to be distributed evenly. Moreover, since the traveling paths within the second conductive layer 220 toward the first side 136A and the second side 136B are substantially equal in distance, the time delay may be eliminated. The configuration of the heterojunction bipolar transistor 70B may allow the signal input S to be fed into the base layer 136 at both the first side 136A and the second side 136B. With the configuration of double signal input, the base resistance may be reduced. The improved base resistance may allow the heterojunction bipolar transistor 70B to exhibit a more superior gain performance under a higher operating frequency.

Figure 8A:
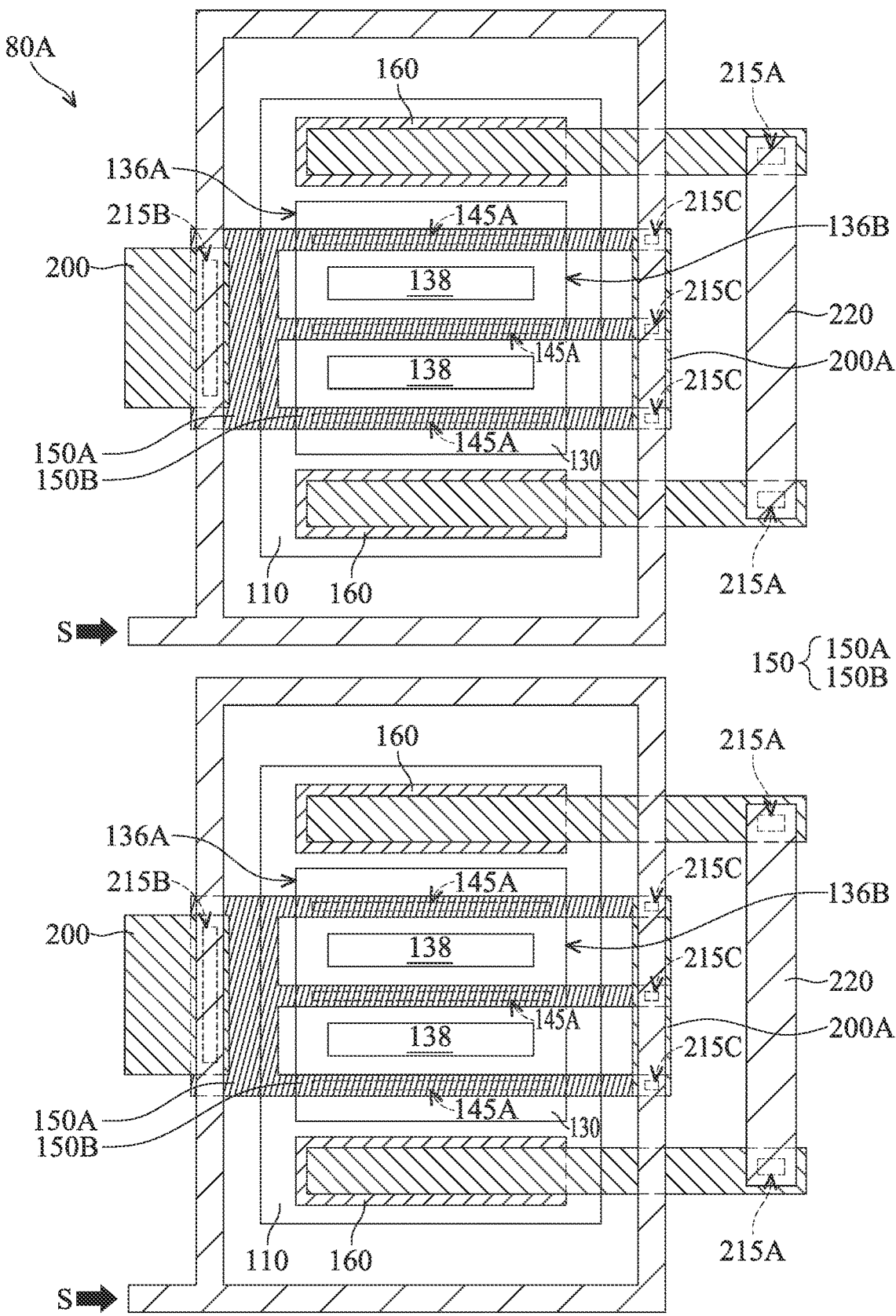
FIGS. 8A and 8B are top views of power amplifiers with different designs, according to some embodiments of the present disclosure.
Figure 8B:
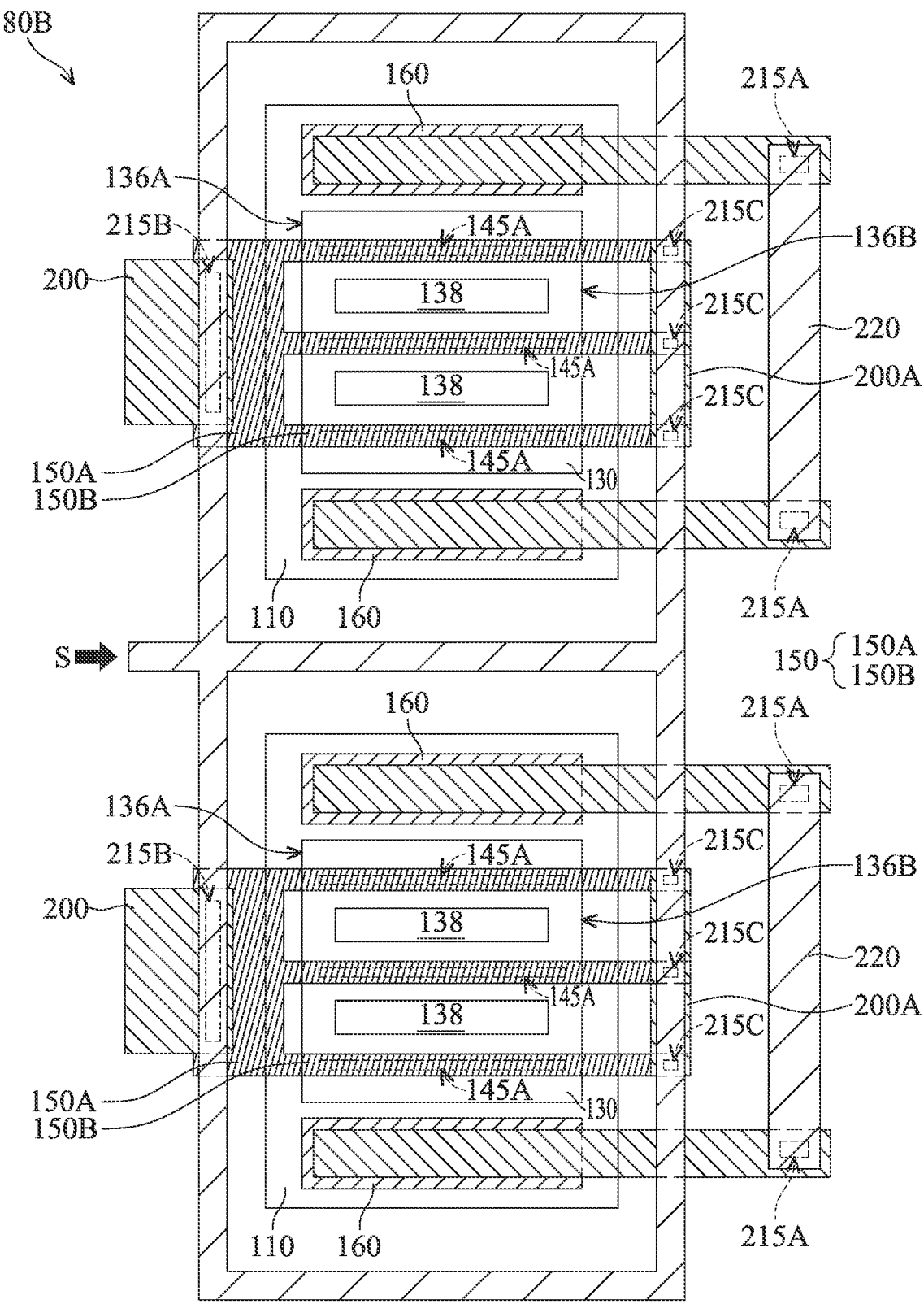

FIGS. 8A and 8B are top views of power amplifiers 80A and 80B with different designs, according to some embodiments of the present disclosure. In comparison with FIG. 7A, the power amplifiers 80A and 80B illustrate two of the heterojunction bipolar transistors 70A placed together. For simplicity, the features of the elements having the same reference numerals are similar to those illustrated in FIG. 7A, and the details are not described again herein to avoid repetition.

Referring to FIG. 8A, the heterojunction bipolar transistors are placed adjacent to each other. As mentioned previously, the signal input S may reach the first side 136A and the second side 136B of the base layer 136 at almost the same time. Furthermore, the phase delay and/or the skin effect may be improved, in which the improvement is especially notable in higher frequency. The configuration of the power amplifier 80A may allow the signal input S to be fed into the base layer 136 at both the first side 136A and the second side 136B. With the configuration of double signal input, the base resistance may be reduced. The improved base resistance may allow the power amplifier 80A to exhibit a more superior gain performance under a higher operating frequency.

Referring to FIG. 8B, the power amplifier 80B is illustrated. In comparison with FIG. 8A, the heterojunction bipolar transistors are electrically coupled with each other by sharing one of the transmitting portions 220B of the second conductive layer 220. When the closed loop portions of both heterojunction bipolar transistors are partially overlapped with each other, less circuitry space may be consumed, which is advantageous for the overall device miniaturization. Moreover, a single signal input S may be fed into both heterojunction bipolar transistors. As mentioned previously, the signal input S may reach the first side 136A and the second side 136B of the base layer 136 at almost the same time. Furthermore, the phase delay and/or the skin effect may be improved, in which the improvement is especially notable in higher frequency. The configuration of the power amplifier 80B may allow the signal input S to be fed to the base layer 136 at both the first side 136A and the second side 136B. With the configuration of double signal input, the base resistance may be reduced. The improved base resistance may allow the power amplifier 80B to exhibit a more superior gain performance under a higher operating frequency.

Figure 9:
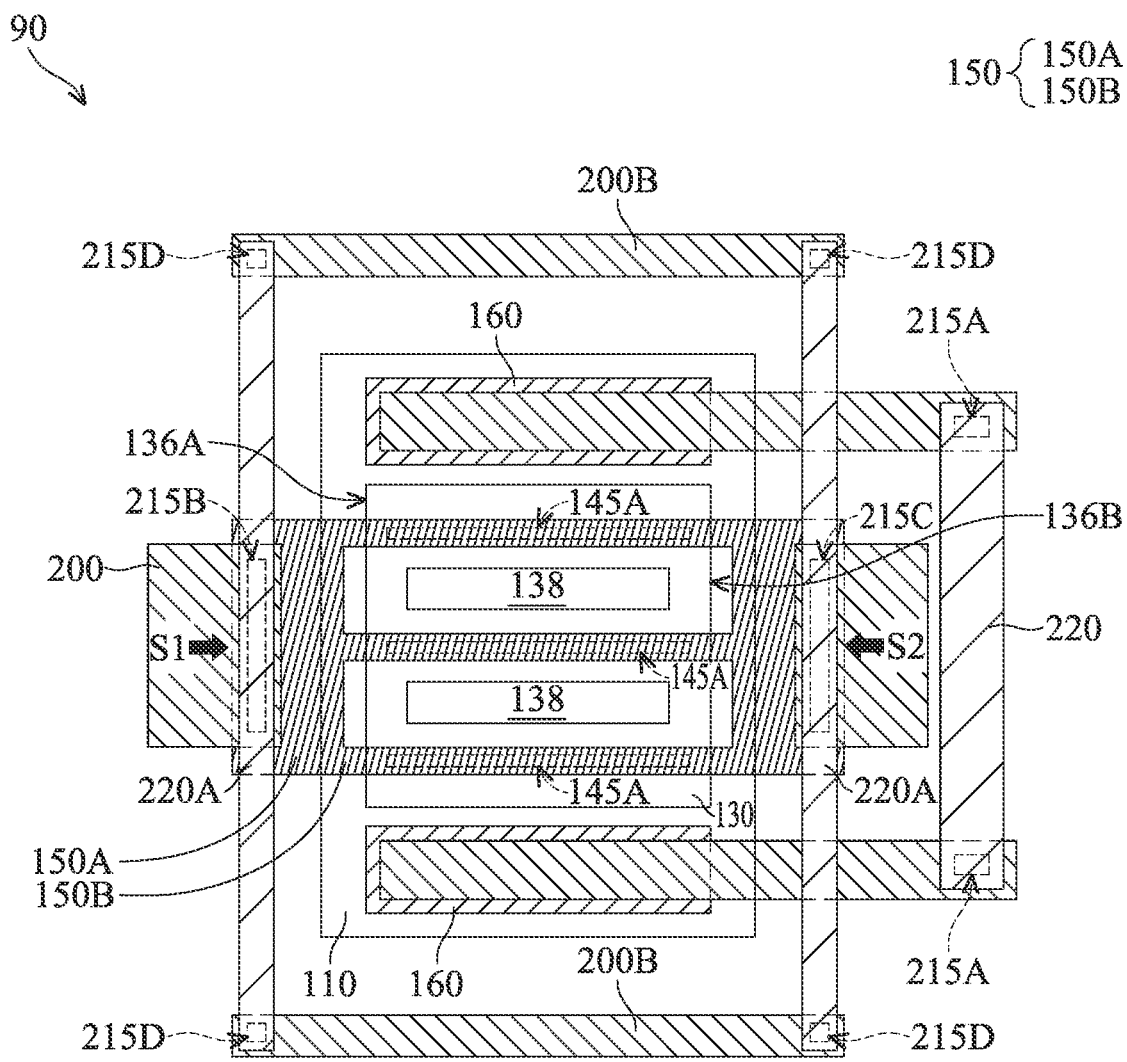
FIG. 9 is a top view of a heterojunction bipolar transistor, according to some embodiments of the present disclosure.

FIG. 9 is a top view of a heterojunction bipolar transistor 90, according to some embodiments of the present disclosure. In comparison with FIG. 5, the transmitting portions 220B of the second conductive layer 220 may be replaced with transmitting portions 200B of the first conductive layer 200. In some embodiments, the conducting portions 220A of the second conductive layer 220 may be electrically connected to the transmitting portions 200B of the first conductive layer 200 through via holes 215D. For simplicity, the features of the elements having the same reference numerals are similar to those illustrated in FIG. 5, and the details are not described again herein to avoid repetition.

Referring to FIG. 9, after forming the dielectric film to be inserted between the first conductive layer 200 and the second conductive layer 220, the via holes 215D may be formed in the dielectric film. The via holes 215D may be arranged on the transmitting portions 200B of the first conductive layer 200. The formation of the via holes 215D may be similar to that of the via holes 215A, and the details are not described again herein to avoid repetition.

Still referring to FIG. 9, it is worth noted that the closed loop encircling the base mesa 130 may be constituted by both the first conductive layer 200 and the second conductive layer 220, instead of only the second conductive layer 220. As mentioned previously, even though the closed loop portion of the heterojunction bipolar transistor 90 is constituted by two different metal layers, the signal input may still transmit between opposite sides of the base electrode 150 using the path different from the path through the plurality of finger portions 150B of the base electrode 150, thus the base resistance may be reduced. The improved base resistance may allow the heterojunction bipolar transistor 90 to exhibit a more superior gain performance under a higher operating frequency.

The heterojunction bipolar transistor or the power amplifier of the present disclosure can demonstrate a reduction in the base resistance by adding a new signal input to the existing signal input at the base terminal. With the configuration of double signal input, the stability factor (when k=1) for the maximum stable gain and/or the maximum available gain may be prolonged toward a higher frequency. As a result, the heterojunction bipolar transistor and the power amplifier may exhibit a more superior gain performance under a higher operating frequency.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A heterojunction bipolar transistor, comprising:
    a substrate;
    a bottom sub-collector layer disposed on the substrate;
    an upper sub-collector layer disposed on the bottom sub-collector layer;
    a collector layer disposed on the upper sub-collector layer;
    a base layer disposed on the collector layer, wherein the base layer, the collector layer and the upper sub-collector layer form a base mesa, and wherein in a top view, the base layer comprises a first side and a second side opposite to the first side;
    an emitter layer disposed on the base layer;
    a first dielectric film disposed on the bottom sub-collector layer and the base mesa;
    a base electrode disposed on the first dielectric film and connected to the base layer through a first via hole disposed in the first dielectric film;
    a second dielectric film disposed on the base electrode; and
    a first conductive layer disposed on the second dielectric film, wherein the first conductive layer is connected to the base electrode through a second via hole disposed in the second dielectric film at the first side of the base layer, the first conductive layer is connected to the base electrode through a third via hole disposed in the second dielectric film at the second side of the base layer, and the second via hole and the third via hole are laterally spaced away from the base layer.

2. The heterojunction bipolar transistor as claimed in claim 1, wherein the base electrode comprises a first connection portion at the first side of the base layer, and a first finger portion and a second finger portion which are connected to the first connection portion.

3. The heterojunction bipolar transistor as claimed in claim 2, wherein the first conductive layer is connected to the first connection portion of the base electrode through the second via hole at the first side of the base layer.

4. The heterojunction bipolar transistor as claimed in claim 2, wherein the base electrode further comprises a second connection portion at the second side of the base layer, and the first finger portion and the second finger portion are further connected to the second connection portion.

5. The heterojunction bipolar transistor as claimed in claim 4, wherein the first conductive layer is connected to the first connection portion of the base electrode through the second via hole at the first side of the base layer and is connected to the second connection portion of the base electrode through the third via hole at the second side of the base layer.

6. The heterojunction bipolar transistor as claimed in claim 4, wherein the first connection portion, the second connection portion, the first finger portion and the second finger portion of the base electrode form a closed loop.

7. The heterojunction bipolar transistor as claimed in claim 6, wherein the closed loop encircles the emitter layer.

8. The heterojunction bipolar transistor as claimed in claim 3, wherein the first finger portion of the base electrode comprises a first end at the second side of the base layer, the second finger portion of the base electrode comprises a second end at the second side of the base layer, the first conductive layer comprises a second connection portion, and the second connection portion of the first conductive layer is connected to the first end of the first finger portion through the third via hole at the second side of the base layer.

9. The heterojunction bipolar transistor as claimed in claim 8, wherein the second connection portion of the first conductive layer is further connected to the second end of the second finger portion through a fourth via hole disposed in the second dielectric film at the second side of the base layer.

10. The heterojunction bipolar transistor as claimed in claim 9, wherein the first connection portion, the first finger portion and the second finger portion of the base electrode, and the second connection portion of the first conductive layer form a closed loop.

11. The heterojunction bipolar transistor as claimed in claim 1, further comprising:
    a collector electrode disposed on the substrate, wherein the collector electrode extends from a top surface of the bottom sub-collector layer to a tapered sidewall of the base mesa.

12. The heterojunction bipolar transistor as claimed in claim 11, wherein the collector electrode is connected to the upper sub-collector layer through a fourth via hole disposed in the first dielectric film.

13. A heterojunction bipolar transistor, comprising:
    a substrate;
    a base mesa disposed on the substrate, wherein the base mesa comprises a collector layer and a base layer disposed on the collector layer, and wherein in a top view, the base layer comprises a first edge and a second edge opposite to the first edge;

an emitter layer disposed on the base layer;

a base electrode disposed on the substrate and connected to the base layer;

a dielectric layer disposed on the base electrode, wherein a first via hole is formed in the dielectric layer at the first edge of the base layer, and a second via hole is formed in the dielectric layer at the second edge of the base layer; and a conductive feature disposed on the dielectric layer, wherein the conductive feature is connected to the base electrode through the first via hole and the second via hole.

14. The heterojunction bipolar transistor as claimed in claim 13, wherein the conductive feature and the base electrode form a closed loop.

15. The heterojunction bipolar transistor as claimed in claim 13, wherein the conductive feature comprises a closed loop on the dielectric layer.

16. The heterojunction bipolar transistor as claimed in claim 13, wherein the first via hole is laterally spaced apart from the base layer.

17. The heterojunction bipolar transistor as claimed in claim 16, wherein the second via hole is laterally spaced apart from the base layer.

18. The heterojunction bipolar transistor as claimed in claim 13, wherein the base electrode comprises a first connection portion and a plurality of finger portions connected to the first connection portion, and a lengthwise direction of the finger portions is substantially perpendicular to the first edge of the base layer.

19. The heterojunction bipolar transistor as claimed in claim 13, wherein the base mesa further comprises a sub-collector layer disposed between the substrate and the collector layer.

20. A power amplifier, comprising the heterojunction bipolar transistor as claimed in claim 13.

* * * * *